United States Patent
Augusto

(10) Patent No.: US 7,442,953 B2
(45) Date of Patent: Oct. 28, 2008

(54) WAVELENGTH SELECTIVE PHOTONICS DEVICE

(75) Inventor: Carlos J. R. P. Augusto, San Jose, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 192 days.

(21) Appl. No.: 11/005,842

(22) Filed: Dec. 7, 2004

(65) Prior Publication Data
US 2005/0151128 A1 Jul. 14, 2005

Related U.S. Application Data

(63) Continuation-in-part of application No. 10/023,430, filed on Dec. 14, 2001, now Pat. No. 6,891,869, which is a continuation-in-part of application No. PCT/EP00/05590, filed on Jun. 13, 2000.

(60) Provisional application No. 60/140,671, filed on Jun. 14, 1999.

(51) Int. Cl.
*H01L 33/00* (2006.01)
*H01L 27/14* (2006.01)

(52) U.S. Cl. .............. 257/21; 257/25; 257/27; 257/30; 257/E33.008; 257/E33.053; 257/E33.063; 257/184; 257/459

(58) Field of Classification Search ............ 257/21
See application file for complete search history.

(56) References Cited

U.S. PATENT DOCUMENTS

| | | | |
|---|---|---|---|
| 4,705,361 A | 11/1987 | Frazier et al. | |
| 4,975,567 A | 12/1990 | Bishop et al. | |
| 5,608,230 A * | 3/1997 | Hirayama et al. | 257/18 |
| 5,689,123 A | 11/1997 | Major et al. | |
| 5,696,389 A | 12/1997 | Ishikawa et al. | |
| 6,426,514 B1 * | 7/2002 | Atanackovic | 257/14 |

OTHER PUBLICATIONS

Kanemitsu et al, Physical Review B vol. 56 No. 24 Dec. 15, 1997-II "Photoluminescence from Si/Sio2 single quantum wells by selective excitation" R15 561-564.*

"Characterisation of ALCVD $Al_2O_3$-$ZrO_2$ nanolaminates, link between electrical and structural properties", W.F.A. Besling, E. Young, T. Conard, C. Zhao, R. Carter, W. Vandervorst, M. Caymax, S. De Gendt, M. Heyns, J. Maes, M. Tuominen and Suvi Haukka, Journal of Non-Crystalline Solids vol. 303, Issue 1, May 2002, pp. 123-133.

(Continued)

*Primary Examiner*—Jerome Jackson, Jr.
(74) *Attorney, Agent, or Firm*—Lipsitz & McAllister, LLC

(57) ABSTRACT

A device comprising a number of different wavelength-selective active-layers arranged in a vertical stack, having band-alignment and work-function engineered lateral contacts to said active-layers, consisting of a contact-insulator and a conductor-insulator. Photons of different energies are selectively absorbed in or emitted by the active-layers. Contact means are arranged separately on the lateral sides of the vertical stack for injecting charge carriers into the photon-emitting layers and extracting charge carriers generated in the photon-absorbing layers. The device can be used for various applications for light emission or light absorption. The stack of active layers may also include top and bottom electrodes whereby the device can also be operated as a FET device.

52 Claims, 29 Drawing Sheets

OTHER PUBLICATIONS

"Etch Rates for Micromachining Processing-Part II", K.R. Williams, K. Gupta, M. Wasilik, IEEE Journal of Microelectromechanical Systems, vol. 12, No. 6, Dec. 2003, pp. 761-778.

J.L. Vossen and W. Kern, Eds., "Thin Film Processes," New York, NY: Academic, 1978, ch. V-1, cover sheet and pp. 416-417;422-423.

"International Technology Roadmap for Semiconductors Report 2003 Edition Front End Processes", cover sheet and pp. 23-28.

"Ultrathin Gate Oxide CMOS on (111) Surface-Oriented Si Substrate", H.S. Momose, T. Ohguro, S. Nakamura, Y. Toyoshima, H. Ishiuchi, H. Iwai; IEEE Transactions on Electron Devices, Sep. 2002, vol. 49, No. 9, pp. 1597-1605.

* cited by examiner

WAVELENGTH SELECTIVE PHOTONICS DEVICE

This application is a continuation-in-part of U.S. patent application Ser. No. 10/023,430 filed on Dec. 14, 2001, which is a continuation-in-part of PCT/EP00/05590 filed Jun. 13, 2000, which claims the benefit of U.S. provisional patent application 60/140,671 filed Jun. 14, 1999.

BACKGROUND OF THE INVENTION

The present invention relates to the field of opto-electronic or photonic devices, including photon-absorption and photon-emission processes. U.S. patent application Ser. No. 10/023,430 discloses an opto-electronic device architecture that can be implemented in different materials systems, including silicon and germanium. The essential features of that device architecture are the fabrication of an epitaxial film stack composed of alternating layers of a semiconductor (e.g. Si or Ge) and materials with wide band-gaps that can be made pseudomorphic with respect to the lattice parameter of the semiconductor (Si or Ge). Stacked Quantum Wells (QWs) and short-period SuperLattices (SLs) can be fabricated, having opto-electronic properties unavailable with the same materials in the "bulk" form. The thickness of the insulator and of the semiconductor layers control some very important electronic and photonic properties of the layer stack.

In that device architecture, the wavelength of light (emitted or absorbed) is determined by the energy levels of the QWs or SLs, which are fixed by the thickness of the relevant layers, and therefore are fixed during fabrication of said layers. For certain applications, such as "Dense Wavelength Division Multiplexing" (DWDM), it would be highly advantageous to be able to emit and/or absorb photons with wavelengths within fairly narrow intervals. That can be done in the original architecture by providing one or more active layers (QWs and/or SLs) for each of the wavelengths. However, this solution becomes impractical as the number of wavelengths increases.

One major feature of that device architecture is the provision of lateral contacts which are also band-gap engineered. Band-gap engineering in the vertical direction is common to many opto-electronic devices in several materials systems, but the band-gap engineering of the lateral contacts, as a method of selectively injecting and/or extracting charge carriers into particular sub-bands is was a novel concept.

The fabrication of different sets of lateral contacts to identical quantum wells, determine what kind of carriers are injected and/or extracted at each contact, and thus determine the type of opto-electronic processes to take place inside the quantum well. The architecture allows for several quantum wells (with different sub-bands) to be stacked upon each other, and to have different lateral contacts to each of the quantum wells, or to have some contacts in parallel to several quantum wells.

The band-gap engineering of the lateral contacts is crucial to ensure the proper operation of the device. This is especially true for the case of intersubband transitions. The original concept of the device architecture described in the patent application noted above includes a strategy to perform the energy filtering at the contacts through the careful alignment of the CB or VB edge of insulator materials and the work-function of conductors (metals, or metal suicides, or highly doped semiconductors). Unfortunately, the solution suggested in that patent application does not guarantee the desirable filtering for all carriers in all circumstances. For example, for a carrier traveling along the x-axis, when it meets an energy barrier also along the x-axis, the question of whether the carrier travels over that barrier is entirely dependent on its kinetic energy along the x-axis, and is completely independent from its energy along the other two axes.

SUMMARY OF THE INVENTION

It is an object of the present application to improve the performance of the opto-electronic device described in co-pending patent application Ser. No. 10/023,430 so as to overcome the problems noted above.

This object is achieved by providing improvements to the architecture of opto-electronic devices. The improvements include the provision of novel lateral contacts that can be used for both intersub-band and interband transitions, with the purpose of improving their energy selectivity (filtering capability) to inject charge carriers into and/or extract charge carriers from particular sub-bands in the quantum wells, while not doing so to other sub-bands. The novel lateral contacts include improved "Injector" and "Extractor" contacts/structures.

The improvements also include a new architectural feature, consisting in electrodes placed at the top and at the bottom of the stack of quantum wells. The top and bottom electrodes/contacts enable a voltage-controlled wavelength tuning of the photons emitted and/or absorbed.

The new top and bottom electrodes/contacts also enable new functionalities, in that they can act as the Gate electrodes of a Field Effect Transistor (FET) having the energy-filtered carrier injector as the source.

Because the top and bottom electrodes/contacts can be used to fine-tune the wavelength of emission and/or absorption, as well as be the Gates of FETs, the contacts/electrodes architecture according to the invention makes it possible to fabricate silicon-based light emitting and photo-detector devices, monolithically integrated with high-density electronic circuitry, such as CMOS, The present invention enables the identical stacks of epitaxial layers, consisting of QWs and/or SLs, to be the active layers of light emitting devices, light absorbing devices, and Field-Effect Transistors. The difference between the several device types is provided by the lateral contacts, lateral patterning, and the voltage conditions applied to every electrode/contact.

It is believed that this is the first device structure capable of unifying several functionalities such as
- Transistors
  - N-type MOSFETs, P-type MOSFETs
- Photo-detectors:
  - Lateral PIN interband photo-diode, also capable of avalanche operation
  - N-Type intersub-band Photo-detector
  - P-Type intersub-band Photo-detector
- Light-Emitters:
  - Ambipolar interband Light Emitting Diode or Laser
  - N-type intersub-band Light Emitting Diode or Laser
  - P-type intersub-band Light Emitting Diode or Laser.

DESCRIPTION OF EMBODIMENTS OF THE INVENTION

Figure 1A:
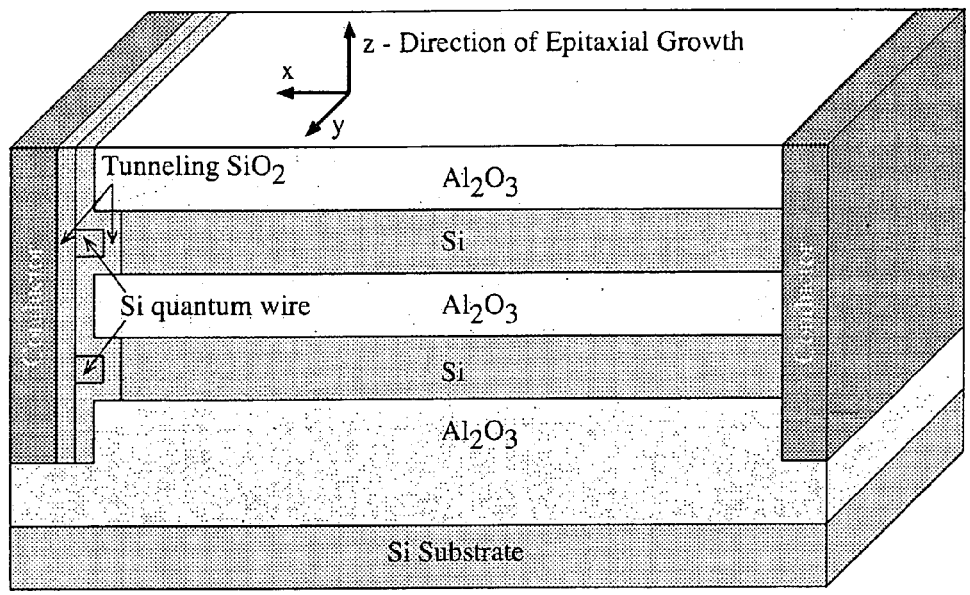
FIGS. 1A-1B illustrate two exemplary embodiments of opto-electronic device including exemplary implementations of lateral contacts of the invention.
Figure 1B:
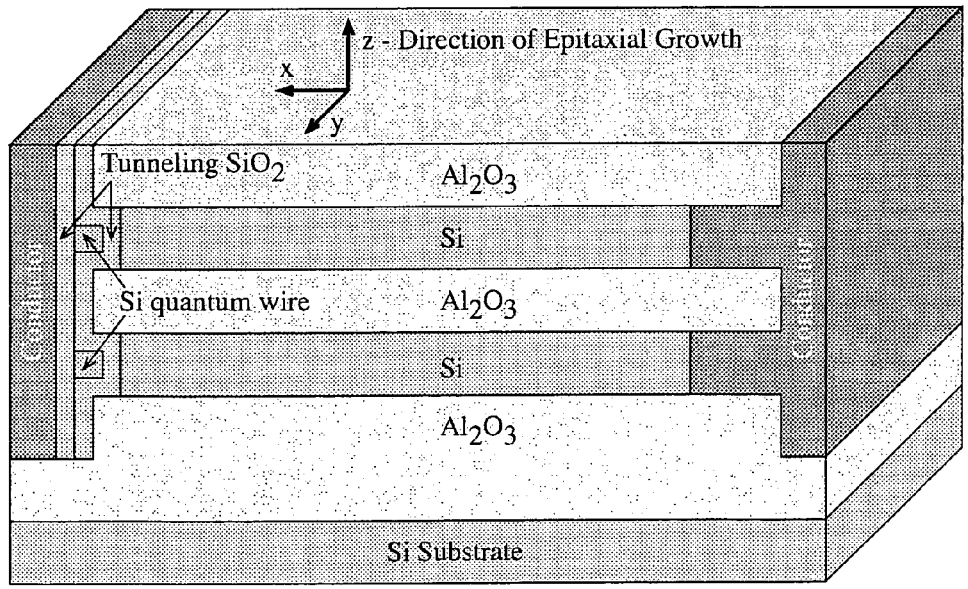

FIG. 1A and FIG. 1B, show two exemplary implementations of the lateral contacts for light emission for interband or intersubband transitions. The implementations include on the left hand side of the stack a novel Quantum Wire Injector (QWI) architecture that is especially useful for light emission through intersubband transitions, both n-type and p-type. The two implementations differ only in the geometry of the "Extractor" contact located on the right hand side of the stack. The geometry of the Extractor contact does not alter the physics or the operation of the device. In these two figures, the conductors used for the QWI and for the extractor are not defined. These conductors can be metals, highly doped semiconductors, or conductive metal-oxides, for example. Band diagrams will illustrate the impact of choosing different conductors.

The QWI as shown in FIG. 1A and FIG. 1B on the left hand side of the structures, is composed of a Si quantum wire encapsulated in an insulator, such as $SiO_2$, with a thickness suitable for tunneling transport, from the "conductor" into the Si quantum wire, and from the Si quantum wire into the Si quantum well and/or superlattice. Carriers are injected from the conductor (3D charge reservoir) through the quantum wire, into the quantum well(s) and/or superlattice, only when a resonant tunneling (along the x-direction) condition is achieved.

At the interface between the edge of the quantum well and the quantum wire, only carriers in which the z-component of the energy matches the energy of the higher sub-band in the quantum well, can be injected into the quantum well and/or superlattice.

Once the carriers are injected into the highest sub-band in the QW and/or SL, the lateral electric field induced by the voltage applied at the lateral contacts makes the carriers in the excited sub-band drift parallel to the QW barriers. Before reaching the extractor contact at the opposite side, scattering will induce transitions to the ground sub-band, resulting in photon emission. Once in the ground sub-band, the carriers will also be driven, by the same lateral electric field, towards the extractor contact, where they leave the QW and/or SL layers, and are collected at another "conductor".

It should be noticed that the "conductors" in FIG. 1A and FIG. 1B are reservoirs of thermalized 3D carriers. If the 3D electrode is p-type doped semiconductor, only holes can be in injected into the QWs and/or SLs. If the 3D electrode is n-type doped semiconductor, only electrons can be injected into the QWs and/or SLs. If the 3D electrode is a metal, both types of carriers can be injected into the QWs and/or SLs. Different metals have different work-function values, which results in different voltages to achieve the desired operation point.

The novel QWI contact provides energy quantization in the vertical direction (z-direction) and in one lateral dimension (e.g. x-direction). The QWI is placed between the edge of the quantum well(s) and a "macroscopic" reservoir of 3D charge carriers (electrons or holes), which can be either a metal or a highly doped semiconductor. Electrons or holes are injected directly into one selected sub-band in the quantum well (or superlattice) at one side, and are extracted at the opposite lateral contact. The lateral dimensions of the quantum wells are such that there is no energy quantization along those directions (x- and y-directions).

This QWI contact is capable of injecting carriers into selected sub-bands that are not the ground state. The ability to inject carriers directly to higher energy sub-bands, and do so with high efficiency, and at a rate that is superior to the rate with which the carriers decay to lower energy sub-bands, provides a truly novel injection process for light emitting devices, including lasers.

The QWI contact can also provide unusual possibilities for light emission through interband transitions. Because the QWI can filter the energy of the carriers injected into the active layers, it becomes possible to inject carriers directly into certain valleys or bands, and only to those valleys or bands. This is particularly relevant for indirect bandgap semiconductors (such as Si and Ge), because it makes possible to inject carriers into higher energy valleys, which in fact have direct band-gaps. Using Ge as an example, it would be possible to inject carriers into the valley in the conduction band of Ge that has a 0.8 eV direct band-gap, while not injecting electrons into the lowest conduction band valley, with indirect band-gap of 0.66 eV. Using Si as an example, it would be possible to inject electrons into one of the conduction band valleys of Si with direct band-gaps (3.1 eV or 4.2 eV), while not doing so to the lowest conduction band valley of Si, with indirect band-gap of 1.1 eV. The capability of selecting the valleys that are injected with carriers, provides for highly efficient light emission through interband transitions, even in indirect band gap semiconductors.

The Extractor contact for light emitting processes operating through sub-band transitions can also be a metal or a highly doped semiconductor. A p-type doped semiconductor is a good extractor for devices with p-type sub-band transitions, a n-type doped semiconductor is a good extractor for devices with n-type sub-band transitions, while a metal with a midgap work-function extracts electrons and holes equally well.

Figure 2A:
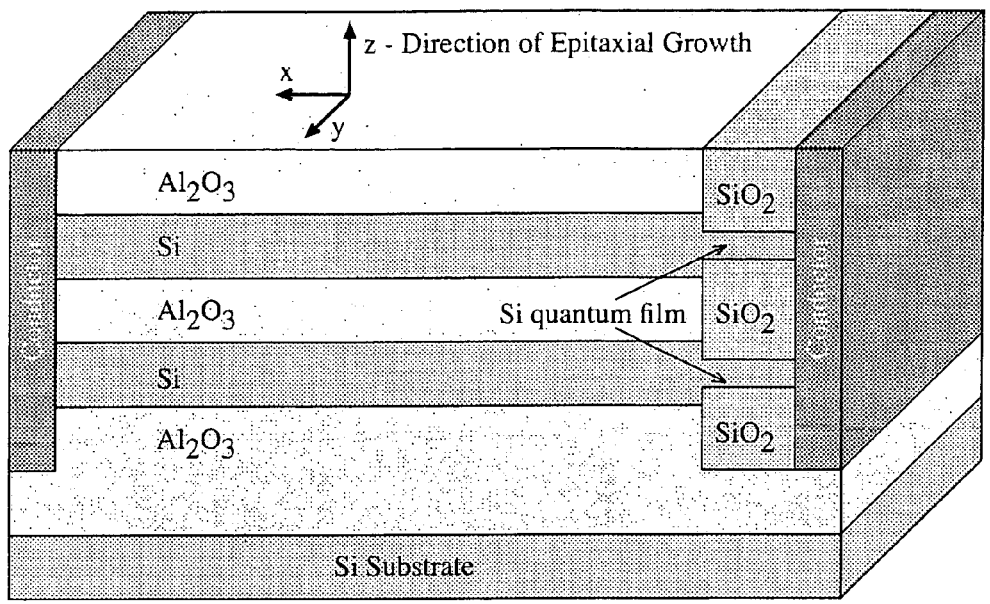
FIGS. 2A-2B illustrate two exemplary embodiments of opto-electronic device including exemplary implementations of lateral contacts of the invention.
Figure 2B:
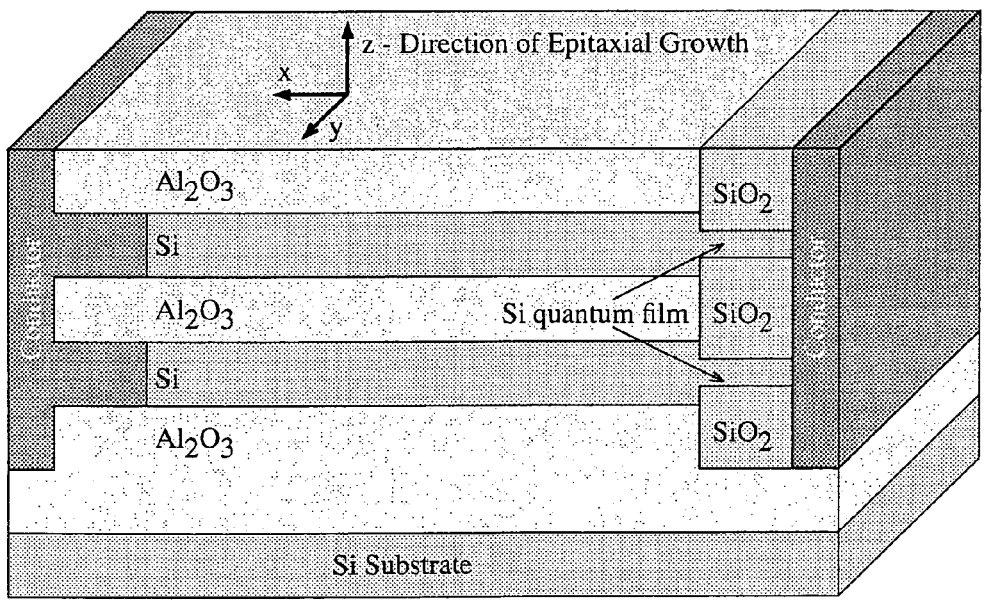

FIG. 2A and FIG. 2B show two exemplary implementations of the lateral contacts for light absorption through interband or intersubband transitions. The implementations include on the right hand side of the stack a novel Quantum Film Extractor (QFE) architecture that is especially useful for light emission through intersubband transitions, both n-type and p-type. The two implementations differ only in the geometry of the "Injector" contact, which does not alter the physics or the operation of the device. In these two figures, the conductors used for the QWI and for the extractor are not defined. These conductors can be metals, highly doped semiconductors, or conductive metal-oxides, for example. Band diagrams will illustrate the impact of choosing different conductors.

The QFE contact on the right hand side of the structures of FIGS. 2A and 2B, is composed of a Si quantum film (not a quantum wire or quantum dot), that is formed by thinning the quantum well (and/or superlattice) epitaxially grown layer, and of a "conductor" electrode. The thinning of the quantum well layer results in sub-band energies (along the z-direction) higher that those of the quantum well itself (also along the z-direction).

The QFE contact provides energy quantization in z-direction, which is placed between the edge of the quantum well(s) and a "macroscopic" reservoir of 3D electrons or holes, which can be either a metal or a highly doped semiconductor. Electrons or holes are injected directly into one sub-band in the quantum well at one side of the device, and are extracted from the another sub-band at the opposite side by the QFE. The lateral dimensions of the quantum wells are such that there is no energy quantization along those directions (x- and y-directions).

This QFE contact is capable of extracting carriers (electrons or holes) from selected sub-bands while blocking carriers from the ground state sub-band. The ability to extract carriers directly from higher energy sub-bands, and do so with high efficiency, while carriers in lower sub-bands are not extracted from the QWs and/or SLs, provides a truly novel extraction process for light absorbing devices. This capability enables the collection of carriers that have been excited by photo-absorption processes, and for that reason lie in higher energy sub-bands, while blocking the "dark current", that is, blocking the carriers residing in the ground state sub-band, that have not absorbed photons.

The QFE contact can also provide unusual possibilities for light absorption through interband transitions. Because the QFE can filter the energy of the carriers extracted from the active layers, it becomes possible to extract carriers only from certain valleys or bands, but not others. Even though the sub-band energy values are essentially determined by the electronic structure of the QWs and/or SLs, if the photo-excited carriers in lower sub-band are not extracted, those sub-bands become quickly saturated with carriers, and cannot accept anymore, essentially preventing the absorption of photons in that energy range. Therefore, the QFE contact can be designed to selectively block lower energy sub-bands, and thus change the absorption characteristics of the QW and/or SL.

Figure 3A:
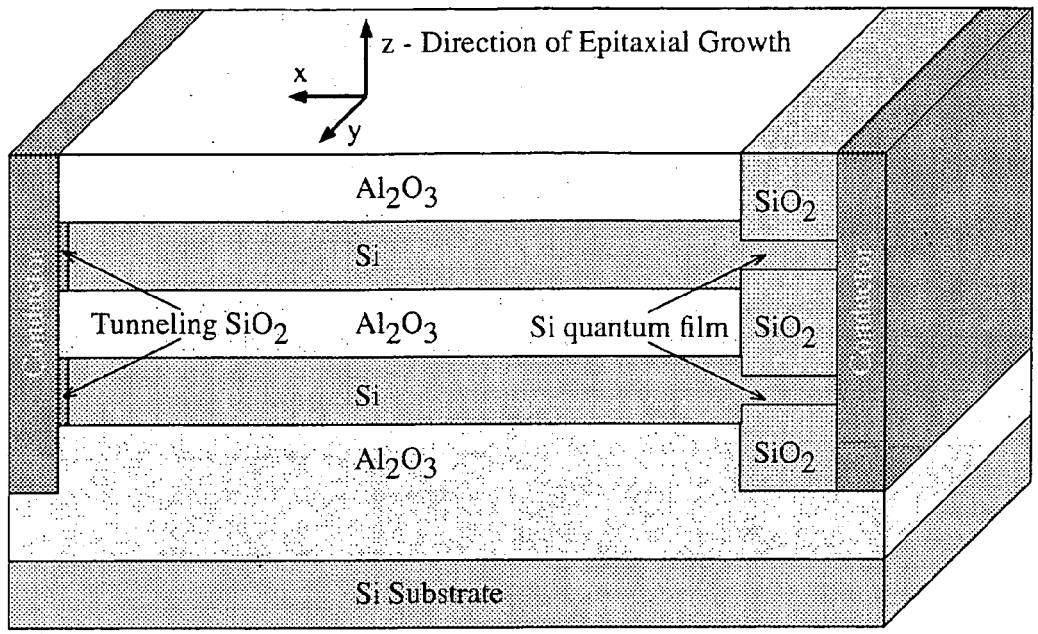
FIGS. 3A-3B illustrate two variations of the exemplary implementations shown in FIGS. 2A and 2B.
Figure 3B:
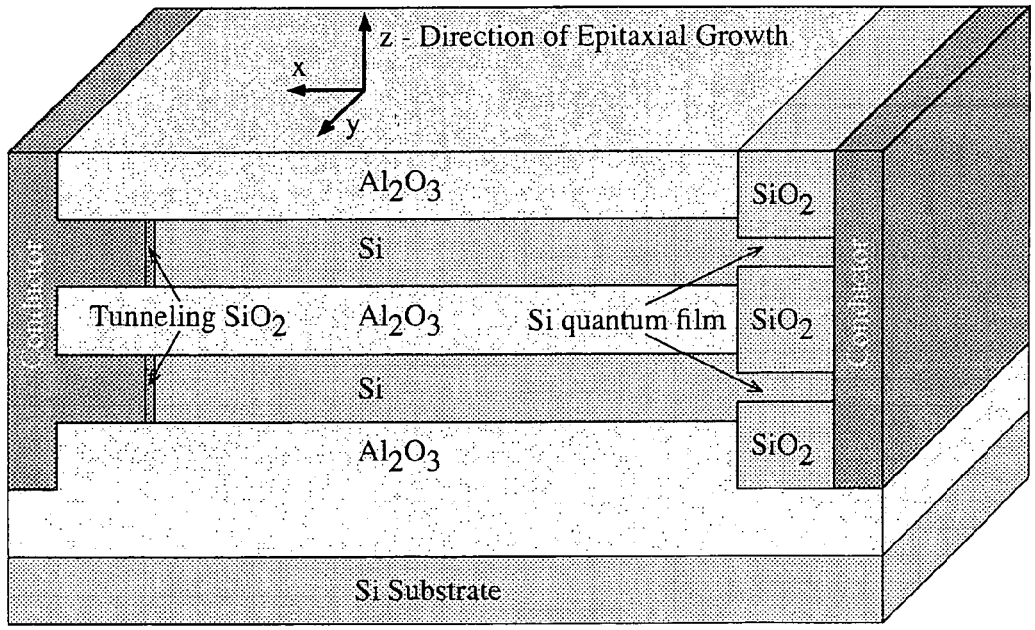

FIG. 3A and FIG. 3B illustrate two exemplary implementations of the lateral contacts for light absorption through interband or intersubband transitions. The implementations include on the right hand side of the stack a novel Quantum Film Extractor (QFE) architecture that is especially useful for light absorption through intersubband transitions, both n-type and p-type. These implementations of the QFE is identical to those of FIGS. 2A and 2B, but there is a different injector on the left hand side of the QWs. FIG. 3A and FIG. 3B differ only in the geometry of the "Injector" contact, which does not alter the physics or the operation of the device. In these two figures, the conductors used for the QFE and for the injector are not defined. These conductors can be metals, highly doped semiconductors, or conductive metal-oxides, for example. Band diagrams will illustrate the impact of choosing different conductors.

Figure 4A:
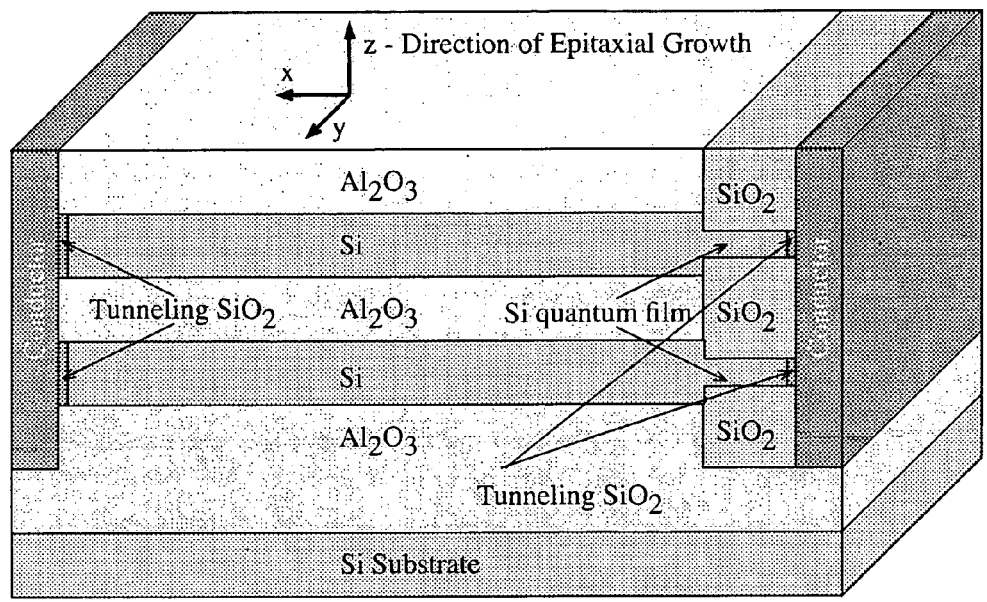
FIGS. 4A-4B illustrate two other variations of the exemplary implementations shown in FIGS. 2A and 2B.
Figure 4B:
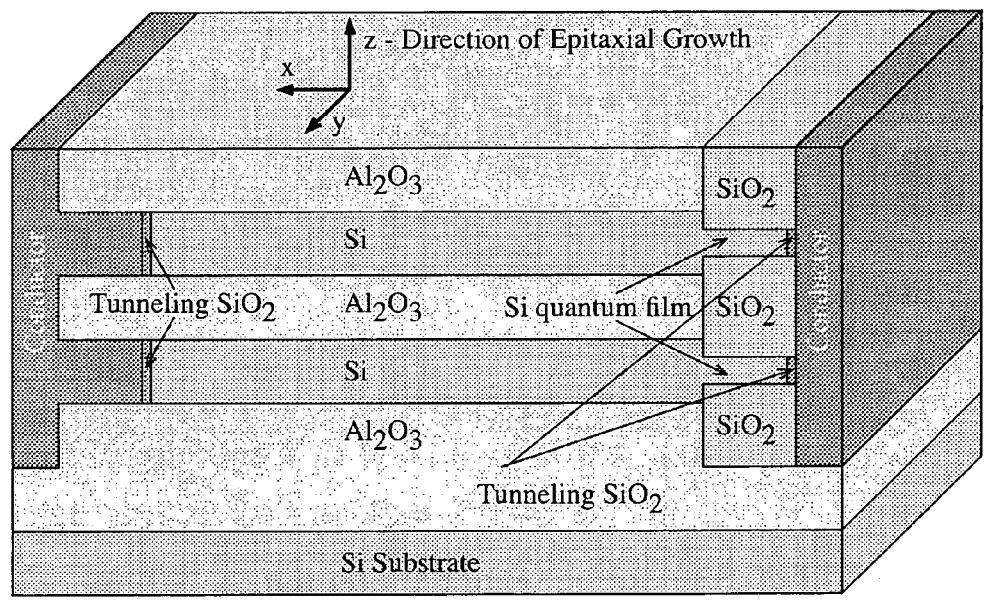

In FIGS. 4A and 4B there is shown another Injector structure on the left hand side of the quantum wells. This Injector structure is a small variation of the "Quantum Film Injector" (QFI) described earlier herein with reference to FIGS. 2A and 2B. An ultra-thin tunneling insulator, e.g. SiO2, is here positioned between the edge of the quantum film and the "conductor material. This arrangement is meant to facilitate the injection into the quantum film, from a conductor whose work-function is not near the energy value of the ground sub-band in the quantum film injector FIGS. 5A to 5D show implementations of the stack of quantum wells including the lateral contacts of FIGS. 1A-4B, with the addition of Top and Bottom electrodes. With the addition of the Top & Bottom electrodes, the total electric field becomes a 2D field, whereas it was simply 1D when there were only the lateral contacts. It must be emphasized that these electrodes are designed to establish electric field effects only, and do not inject or extract current from the quantum well and/or superlattice active layers. Charge injection and extraction remain possible only through the lateral electrodes, and current flows only in the plane of the QWs and/or SLs, not in the vertical direction.

The additional electrodes enable different types of enhancement of the original concept. These enhancements are discussed below.

The materials used for the top and bottom electrodes, as well as the substrate used to support the device layers, depend on the wavelength of operation. For example, for wavelengths whose corresponding photo energy is smaller than, and therefore not absorbed by, the silicon, such as those in the Infra-Red used for telecommunications, then the substrate can be silicon, and thee bottom electrode could also be highly doped silicon, while the top electrode can be highly doped mono-crystalline or poly-crystalline silicon. However, for wavelengths in the visible range, at least the top electrode should be made of a transparent conductor such as Indium Tin Oxide (ITO) for example. If the application does not require the bottom electrode to be transparent to the wavelength of operation, then the bottom electrode can be highly doped mono-crystalline silicon, and the substrate can be silicon.

If the application requires that both the top and the bottom electrodes to be transparent to the wavelength of the operation, then both electrodes can be made of a transparent conductor, such as (ITO). In this case, the fabrication of the bottom electrode (ITO) will require the transfer of the device layers from the original substrate used for the epitaxial growth, to a light transparent substrate, such as sapphire, quartz, plastic, etc.

If the original substrate used for the epitaxial growth of the photo-active layers (quantum barriers, quantum wells and/or superlattices) was an ultra-thin film SOI substrate, such as those envisioned for CMOS generations below 65 nm, then the top silicon film of that substrate is so thin that is optically transparent to wavelengths absorbed by bulk silicon substrates.

Similar comments can be made about germanium bulk substrates and ultra-thin film germanium on insulator substrates, if and when they become easily available.

Modulation of Sub-band Energy by Voltage at Top/Bottom Electrodes

There are different scenarios for the interaction between applied voltage at the top and bottom electrodes, and how it impacts the operation of the original concept, already incorporating the improved lateral contacts.

For a "flat band condition" along the vertical direction, it is as if the top and bottom electrodes did not exist.

If the quantum wells and/or superlattices are symmetric along the vertical direction, the resulting physical effect does not depend on the polarization of the vertical electric field, and it depends only on the magnitude of the vertical electric field.

If the quantum wells and/or superlattices are not symmetric along the vertical direction, then the physical effects of the applied voltage at the top and bottom electrodes, is dependent on both the magnitude and polarization of the vertical electric field.

Without the effect of a vertical electric field, i.e., in the "flat band condition", the energy values of the sub-bands are entirely dictated by the band offsets between the different materials, along the vertical direction. The effects of electric fields on the sub-bands of quantum wells are covered in text books such as [John Davies, "The Physics of Low-Dimensional Semiconductor Structures", Cambridge University Press, 1998, Chapter 7.2.2 pp. 257-260, and Chapter 10.7.4 pp. 404-405].

Typically, quantum wells formed by alternating layers of different materials are square wells, but when a vertical electric field is applied, the wells become triangular. The wave function becomes asymmetric and the "mean position" moves to away from the center of the well, towards the side (top or bottom) whose energy has been lowered by the electric field.

For small electric fields there is a shift (lowering) in energy, equivalent to the energy of the induced dipole, that is proportional to the square of the electric field. The vertical field also impacts the exciton lifetime, which tends to increase the energy of the opto-electronic transitions. However for fields perpendicular to the quantum wells, the first effect dominates, and thus there is a lowering of the opto-electronic transitions in quantum well and/or superlattice sub-bands. Increasing the electric field results in broader absorption and/or emission lines.

Given the structure of the device of the present invention, the shift in the energy and line width of opto-electronic transitions depends not only of the vertical electric field, but also on the in-plane electric field, generated by the voltage applied at the lateral contacts. Therefore, there is a wide parameter space to, controlled by the voltages applied at the top/bottom and at the lateral electrodes, that allows for fine tuning of photon energy, as well as line width of the opto-electronic transitions.

Operation of Device as Field Effect Transistor (FET)

The addition of the top/bottom electrodes to the device architecture enables an additional mode of operation not possible before: the device can be operated as a Field Effect Transistor (FET), in which the top/bottom electrodes can be used as the "Gate" of a FET, and the lateral contacts can operate as the Source and Drain. The quantum well(s) and/or superlattice form the channel region of the FET. In this FET, the voltage applied at the Gate does not generate a sub-band structure in the channel, because it is already formed by the boundary conditions of the quantum well(s), but will provide control on the charge carrier density in the channel, thereby controlling the current flowing through it.

As already described above herein, the modified lateral contacts of the present invention make the device to be asymmetric. The Quantum Wire Injector (QWI) or the Quantum Film Injector perform the role of the "Source" and the Quantum Film Extractor (QFE) performs the role of the "Drain". Therefore, in this FET the channel region is not directly interfaced with a charge reservoir of 3D carriers, as it is the case with conventional FETs, or even ultra-thin film SOI devices (single- or double-gate).

This FET is unique in that the source comprises a quantum wire that is surrounded by a thin layer of an insulator (for example SiO2). In order for 3D carriers to move into the channel region, they have to undergo resonant tunneling through the quantum wire, which acts as an energy filter along the two axes of its cross section. The injection of carriers into the channel will depend on the Gate voltage as well as the Drain voltage. This injection structure and mechanism, further distinguishes the present device from ultra-thin-film SOI devices in which the source/drain regions are also very thin films overlapped by the Gate(s). In those SOI devices, the source is not a quantum wire, but a quantum film, and the charge carrier injection into the channel is through drift-diffusion processes, and not by resonant tunneling.

The resonant tunneling process through the quantum wire (injector/source), acts as an energy filter, with respect to all carriers in the thermalized reservoir of 3D carriers. Of all the 3D carriers in the reservoir, only those that match the energy quantization imposed by the quantum wire are allowed into the channel region. These characteristics are in sharp contrast with those of conventional source regions, from which all carriers with energy above the source/channel barrier are allowed into the channel region.

The present invention does not suffer from "Drain Induced Barrier Lowering" (DIBL) or similar effects detrimental to conventional homojunction MOSFETs, responsible for the increased "off-state" currents as CMOS is scaled down. The increased density of power dissipation in conventional CMOS could become the ultimate barrier to further decrease device dimensions and/or to further increase density of integration.

Given that the Source and Drain layers of FETs are identical to the Injector and Extractor contacts for operation as Photo-Emitters, and given that the quantum well(s) (and/or superlattice) epitaxial layers are also identical, the two types of operations are selected through the lateral patterning of the epitaxial quantum well(s) (and/or superlattice) layers.

For FETs it is beneficial to have a short distance between contacts, that is, a short channel length. The shorter the distance, the smaller the probability of scattering events while traveling through the channel region. For silicon active layers, it is estimated that electrons travel ballistically at room temperature for distances shorter than 30 nm. For holes the required distance for ballistic transport at room temperature could be somewhat shorter.

For Photo-Emitters, the emission of a photon, requires scattering event. Without a scattering even, the carriers would be injected and collected without emitting photons. Therefore, it is beneficial that the distance between the Injector and Extractor contacts is such that there is a high probability of scattering before the carriers are extracted from the quantum well(s) (and/or superlattices).

In addition to this requirement for carrier scattering, the distance between Injector and Extractor contacts must also be sufficient to support the optical mode correspondent to the wavelength of the photons being emitted.

When the conductor material in FIGS. 4A and 4B, is a metal with work-function in the midgap of the channel material, and when the top and bottom electrodes have also work-functions in the midgap of the channel material, the operation as FET has very special properties. The source (injector) can inject electrons or holes, depending on the applied voltage. The drain (extractor) region is equally capable of extracting electrons or holes. In this particular case the same FET device can then behave as a N-type FET or a P-type FET. Some of the unusual properties enabled by such capability are described in U.S. Pat. No. 6,674,099.

Device Operation as FET, Photo-Detector and Photo-Emitter

When the "conductor" material of the lateral contacts has a midgap work-function, and when the top and bottom electrodes have also midgap work-functions, the same device can be operated as N-type and P-type FET. It can also operate as a light emitter and a light absorber, whose wavelength of operation can be controlled by the vertical electric field set by the voltage applied to the top and bottom electrodes. The wavelength of operation as light emitter and light absorber can also be controlled by the lateral electric field, set by the voltage applied to the lateral contacts. For light emission and light absorption, it is necessary that the top and bottom electrodes are transparent to the wavelength range of operation.

It should also be noted that with the proper device dimensions, namely the length of the QFE (along the x-axis), when operating the device as photo-detector, there is a lateral electric field at which there is impact ionization, and therefore avalanche gain, in the region of the QFE. With such device architecture and choice of materials, the threshold for impact ionization is likely to be increased with respect to bulk silicon, by the widening of the band-gap that results from the quantization in the QFE.

Exemplary Band Diagrams with New QWI and QFE Contacts

Figure 6A:
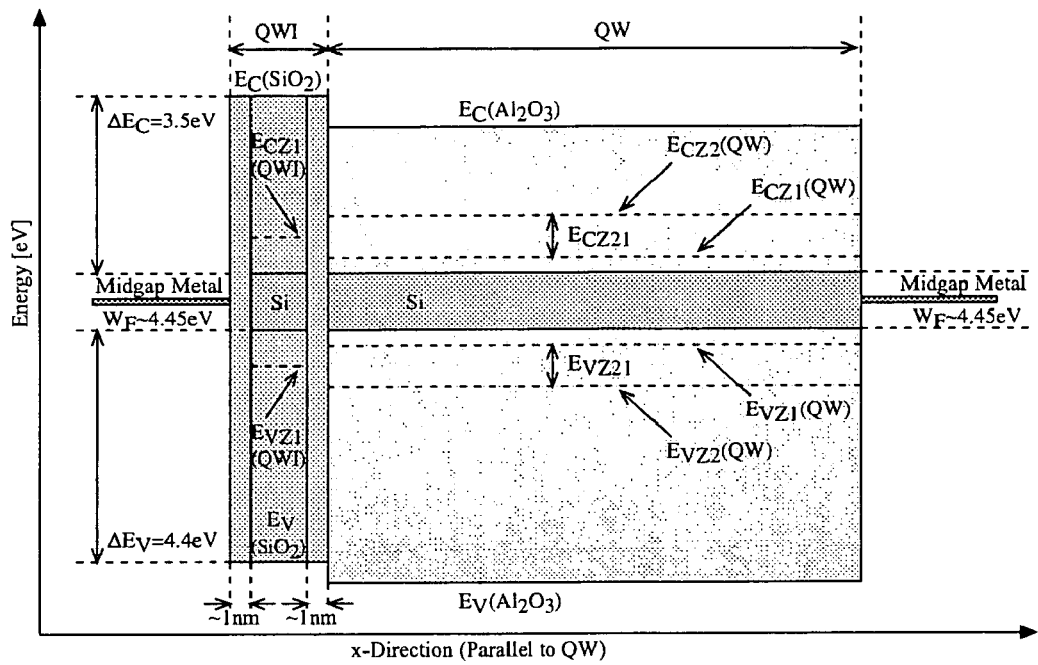
FIG. 6A shows the band diagram for the structure of FIG. 1A, for the "flat-band condition", in which the "conductor" is a metal with midgap work-function.
Figure 6B:
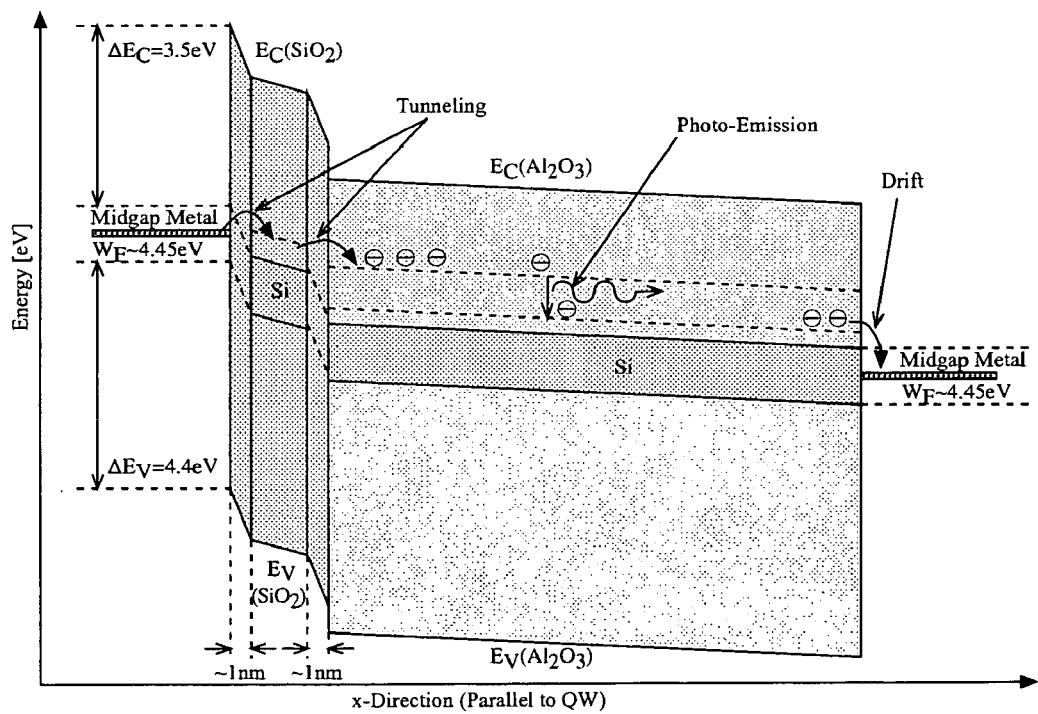
FIGS. 6B-6C show band diagrams of the same structure and same metal, when voltage is applied for light emission through n-type intersub-band transitions, and p-type inter-sub-band transitions, respectively.
Figure 6C:
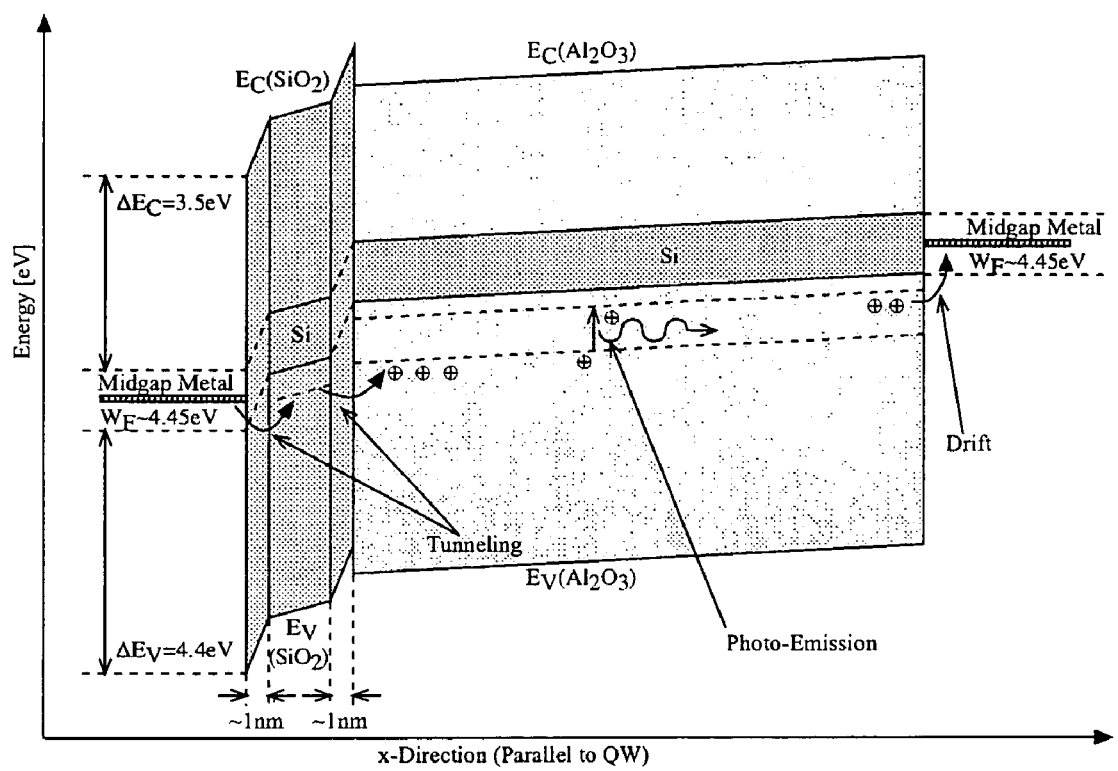

FIG. 6A, shows the band diagram for the structure of FIG. 1A, for the "flat-band condition", in which the "conductor" is a metal with midgap work-function. FIGS. 6B and 6C, show band diagrams of the same structure and same metal, when voltage is applied for light emission through n-type intersubband transitions, and p-type intersubband transitions, respectively.

The new QWI as shown in FIG. 1A and FIG. 1B, is the lateral contact on the left hand side of the structures. It is composed of a Si quantum wire encapsulated in an insulator, such as SiO2, with a thickness suitable for tunneling transport, from the "conductor" into the Si quantum wire, and from the Si quantum wire into the Si quantum well and/or superlattice. Carriers are injected from the conductor (3D charge reservoir) through the quantum wire, into the quantum well(s) and/or superlattice, only when a resonant tunneling (along the x-direction) condition is achieved.

At the interface between the edge of the quantum well and the quantum wire, only carriers in which the z-component of the energy matches the energy of the higher subband in the quantum well, can be injected into the quantum well and/or superlattice.

Once the carriers are injected into the highest subband in the QW and/or SL, the lateral electric field induced by the voltage applied at the lateral contacts makes the carriers in the excited subband drift parallel to the QW barriers. Before reaching the extractor contact at the opposite side, scattering will induce transitions to the ground subband, resulting in photon emission. Once in the ground subband, the carriers will also be driven, by the same lateral electric field, towards the extractor contact, where they leave the QW and/or SL layers, and are collected at another "conductor".

Figure 7A:
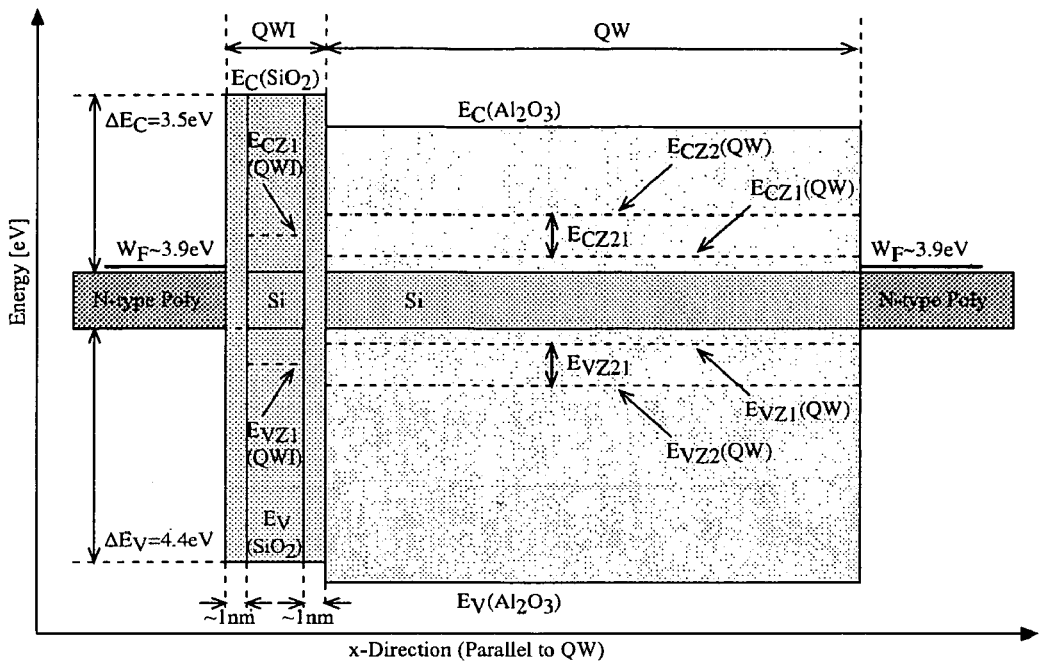
FIG. 7A shows the band diagram for the structure of FIG. 1A, for the "flat-band condition", in which the "conductor" is a n-type poly-Si.
Figure 7B:
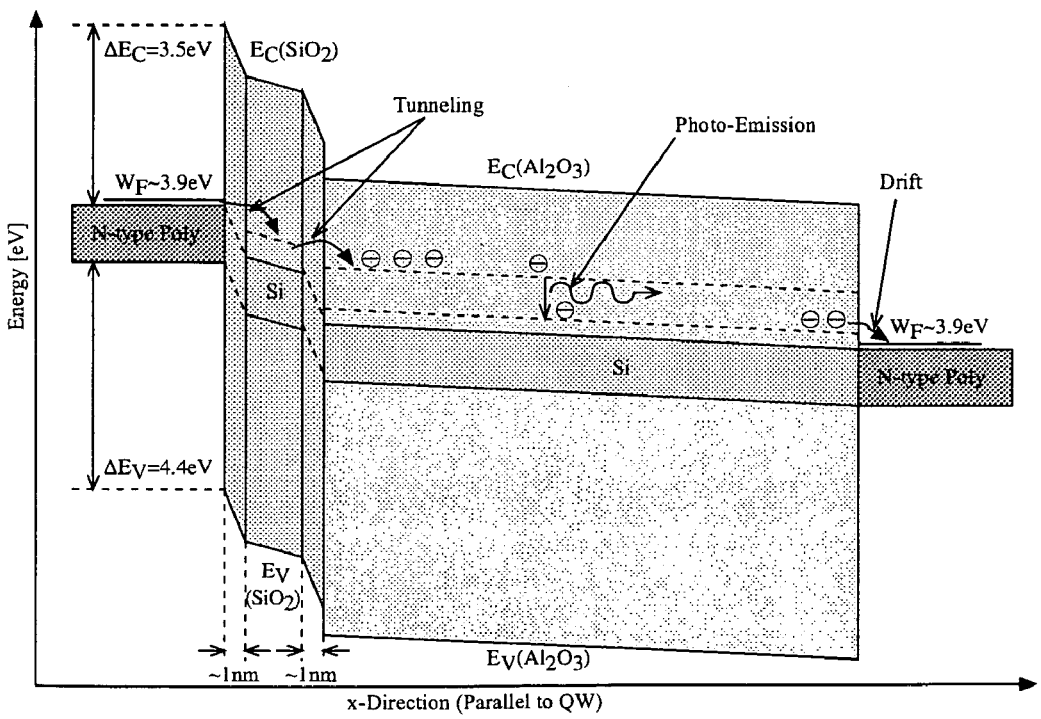
FIG. 7B shows the band diagram of the same structure when voltage is applied for light emission through n-type intersubband transitions.

FIG. 7A, shows the band diagram for the structure of FIG. 1A, for the "flat-band condition", in which the "conductor" is a n-type poly-Si. FIG. 7B shows the band diagram of the same structure when voltage is applied for light emission through n-type intersubband transitions. With n-type poly-Si as the "conductor", it is not possible to have efficient injection and extraction of holes, and therefore it is not possible to have light emission through p-type intersubband transitions. The comments made about the physics of photo-emission depicted in FIG. 6A and FIG. 6B, also apply to the physics depicted in FIG. 7A and FIG. 7B.

Figure 8A:
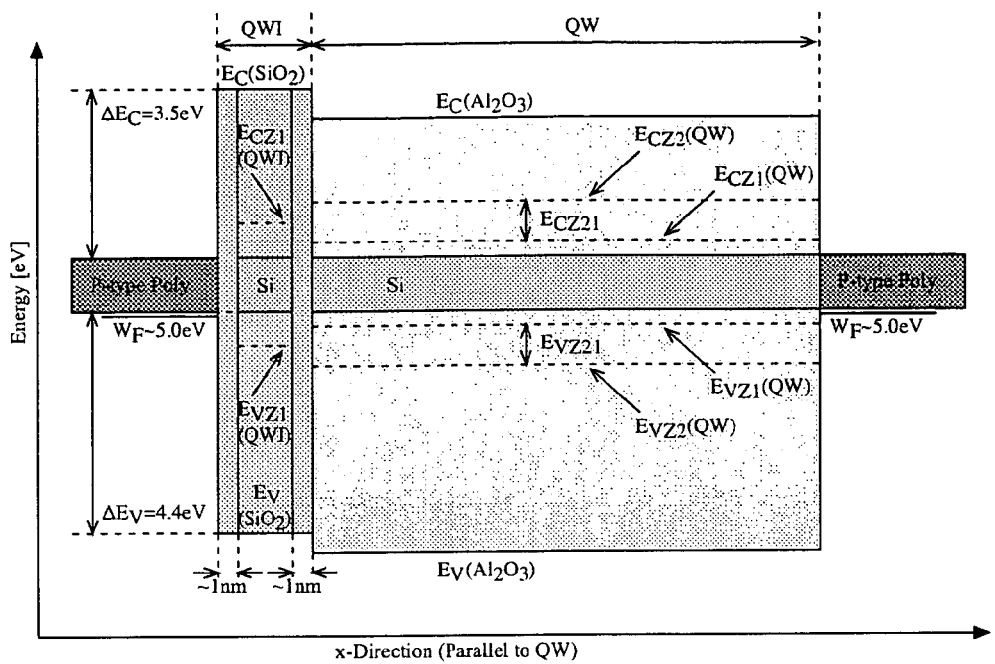
FIG. 8A shows the band diagram for the structure of FIG. 1A, for the "flat-band condition", in which the "conductor" is a p-type poly-Si.
Figure 8B:
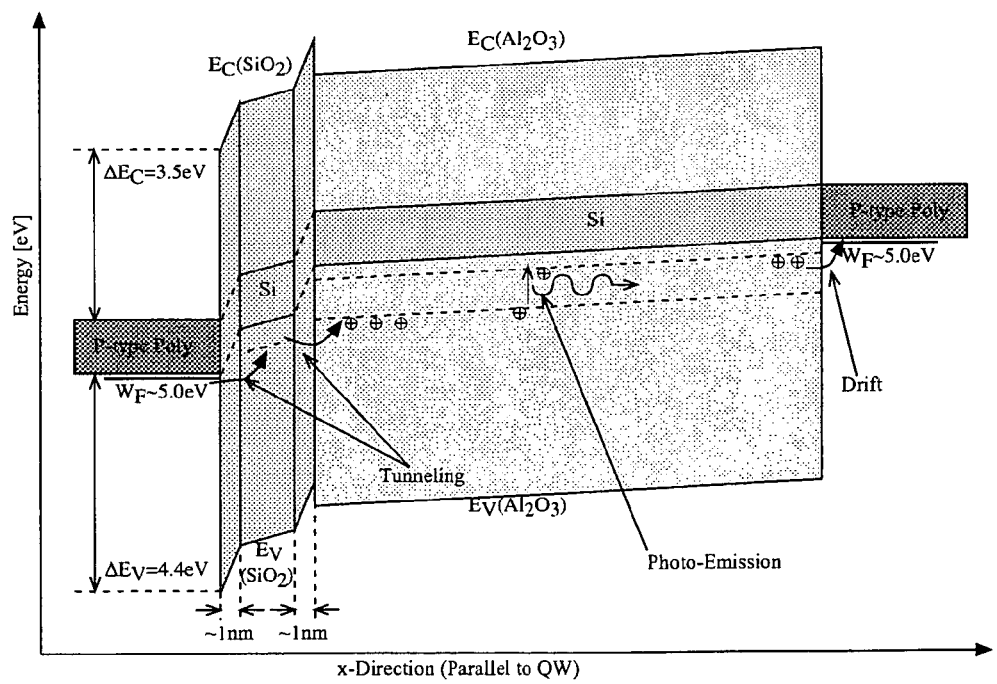
FIG. 8B shows the band diagram of the same structure when voltage is applied for light emission through p-type intersubband transitions.

FIG. 8A, shows the band diagram for the structure of FIG. 1A, for the "flat-band condition", in which the "conductor" is a p-type poly-Si. FIG. 8B shows the band diagram of the same structure when voltage is applied for light emission through p-type intersubband transitions. With p-type poly-Si as the "conductor", it is not possible to have efficient injection and extraction of electrons, and therefore it is not possible to have light emission through n-type intersubband transitions. The comments made about the physics of photo-emission depicted in FIG. 6A and FIG. 6B, also apply to the physics depicted in FIG. 8A and FIG. 8B.

It should be noted that in FIGS. 7A, 7B and 8A, 8B, the "extractor" contact (at the right side of QWs) could also be a metal with midgap work-function, without any significant impact on the operation of the device.

Figure 9A:
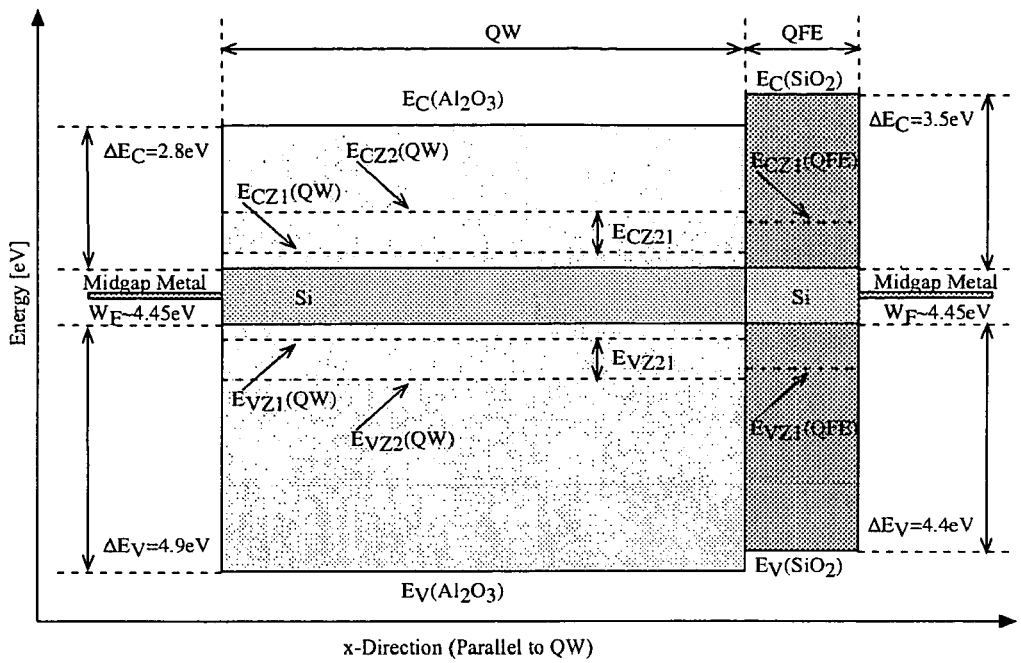
FIG. 9A shows the band diagram for the structure of FIG. 2A, for the "flat-band condition", in which the "conductor" is a metal with midgap work-function.
Figure 9B:
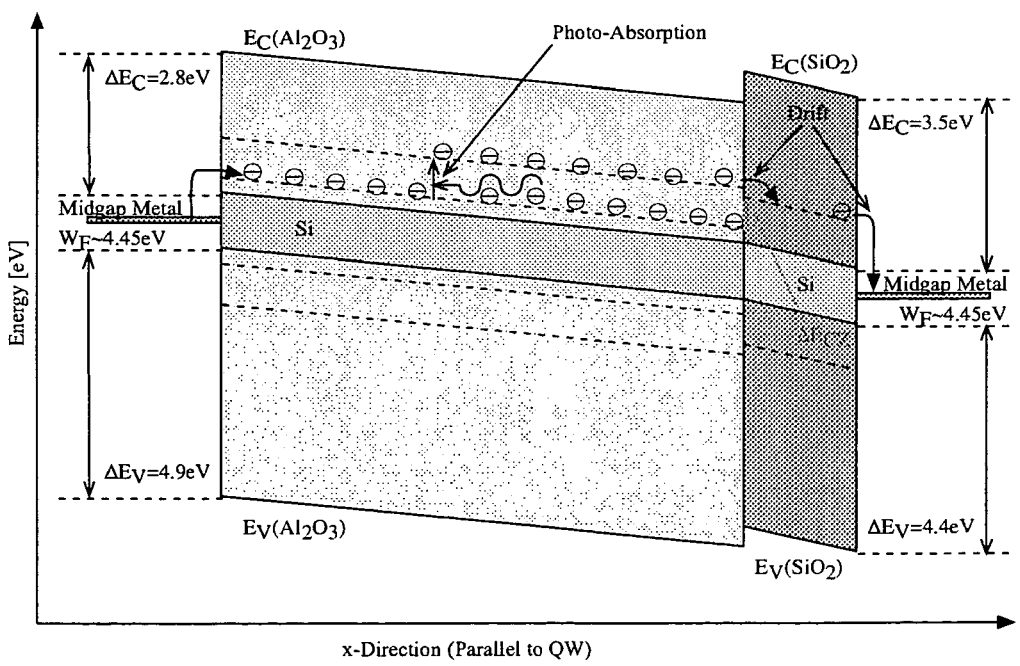
FIGS. 9B-9C show band diagrams of the same structure and same metal, when voltage is applied for light absorption through n-type intersubband transitions, and p-type intersubband transitions, respectively.
Figure 9C:
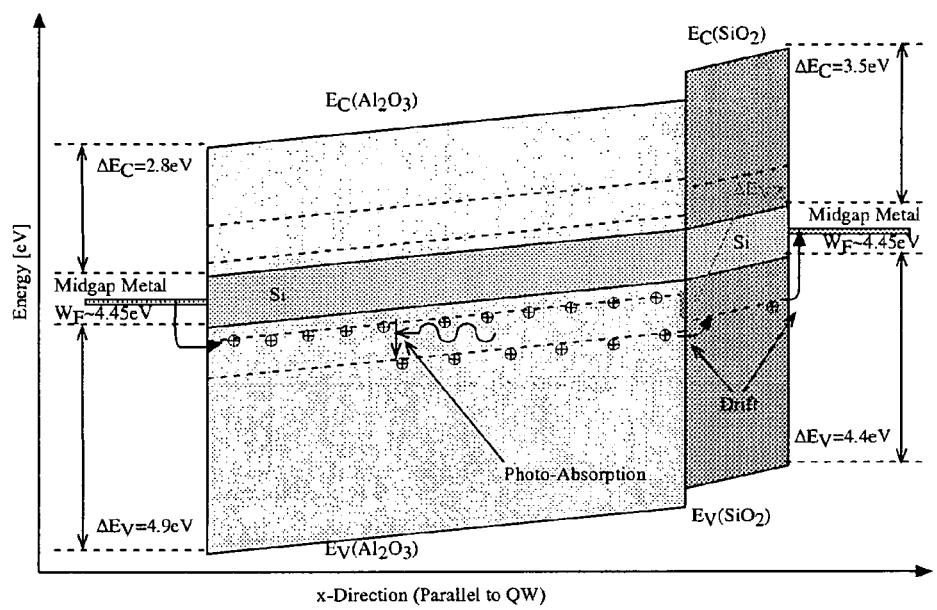

FIG. 9A, shows the band diagram for the structure of FIG. 2A, for the "flat-band condition", in which the "conductor" is a metal with midgap work-function. FIGS. 9B and 9C, show band diagrams of the same structure and same metal, when voltage is applied for light absorption through n-type intersubband transitions, and p-type intersubband transitions, respectively. It should be kept in mind that with this arrangement, the injection of carriers into the lower energy subbands is performed through "thermionic field emission" from a 3D reservoir, into a subband of quantum well and/or superlattice. It is anticipated that this injection mechanism is not very efficient.

The operational principles of the new QFE as shown in FIGS. 9A, 9B, and 9C. The QFE is the lateral contact on the right hand side of the structures of FIGS. 2A and 2B. It is composed of a Si quantum film (not a quantum wire or quantum dot), that is formed by thinning the quantum well (and/or superlattice) epitaxially grown layer, and of a "conductor" electrode. The thinning of the quantum well layer results in subband energies (along the z-direction) higher that those of the quantum well itself (also along the z-direction). The thickness of the QFE layer is such that the energy of its ground state subband (ECZ1(QFE) for electrons and EVZ1(QFE) for holes) is substantially higher than the energy of the ground state in the quantum well (ECZ1(QW) for electrons and EVZ1(QW) for holes), but equal or less than the energy of the excited subband in the quantum well (ECZ2(QW) for electrons and EVZ2(QW).

At the interface between the edge of the quantum well and the QFE, only carriers in which the z-component of the energy is larger than energy of the ground state subband in the QFE can be extracted into the "conductor" next to the QFE. This is equivalent to say that only carriers residing in an excited subband of the quantum well have enough energy (in the z-direction) to cross the interface between the QW and the QFE, and thus be collected at the "conductor" electrode. This is also equivalent to say that there is an energy barrier between the ground states of the QW and of the QFE, that carriers in the ground state of the QW cannot overcome. The energy barriers are: |ΔECZ|=|ECZ1(QFE)−ECZ1(QW)| marked in FIG. 8B, and |ΔEVZ|=|EVZ1(QFE)−EVZ1(QW)| marked in FIG. 8C.

It should be kept in mind that this barrier is for the z-component of the energy, and that the carriers in the QW have the z-component of the energy quantized, and a very narrow range of energies around those quantized values. Therefore the z-component of the energy for the carriers in the QW does not have a broad distribution, in which a significant of the carriers has high energy. For this reason, it is expected that this is a very effective design to suppress "dark current".

Once the carriers are injected into the highest subband in the QW and/or SL, the lateral electric field induced by the voltage applied at the lateral contacts makes the carriers in the excited subband drift parallel to the QW barriers. Before reaching the extractor contact at the opposite side, scattering will induce transitions to the ground subband, resulting in photon emission. Once in the ground subband, the carriers will also be driven, by the same lateral electric field, towards the extractor contact, where they leave the QW and/or SL layers, and are collected at another "conductor".

Figure 10A:
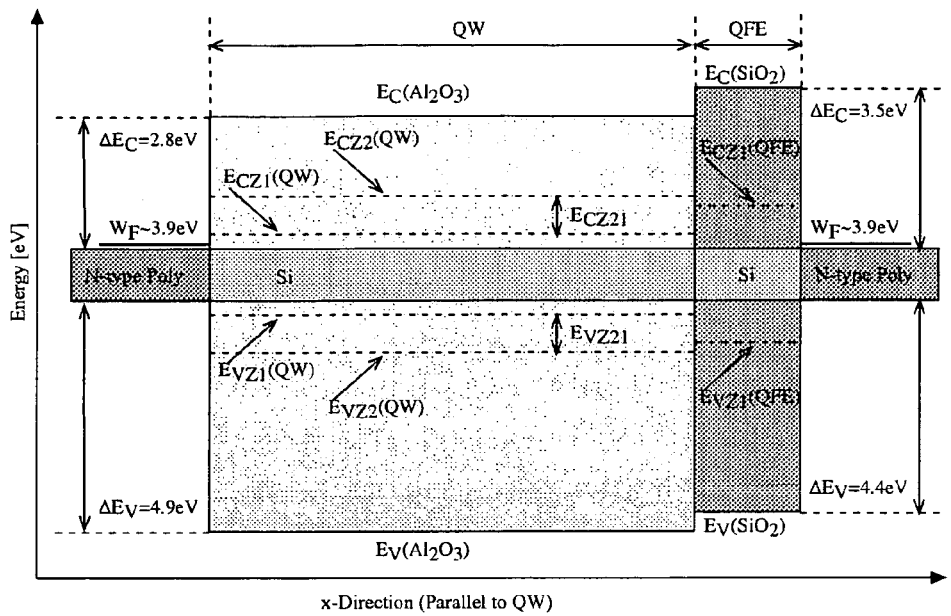
FIG. 10A shows the band diagram for the structure of FIG. 2A, for the "flat-band condition", in which the "conductor" is n-type poly-Si.
Figure 10B:
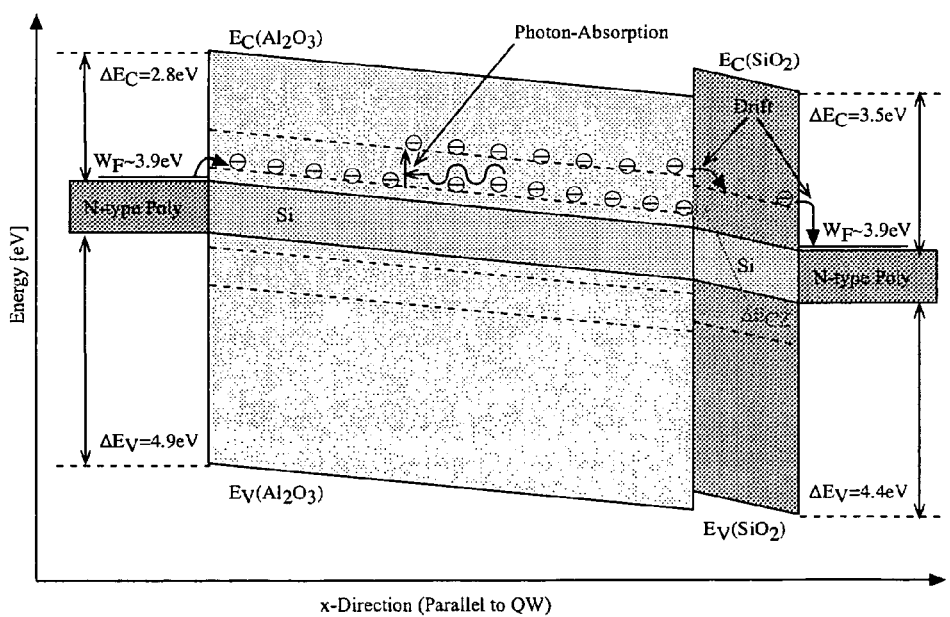
FIG. 10B shows the band diagram of the same structure when voltage is applied for light absorption through n-type intersubband transitions.

FIG. 10A, shows the band diagram for the structure of FIG. 2A, for the "flat-band condition", in which the "conductor" is n-type poly-Si. FIG. 9B shows the band diagram of the same structure when voltage is applied for light absorption through n-type intersubband transitions. With n-type poly-Si as the "conductor", it is not possible to have efficient injection and extraction of holes, and therefore it is not possible to have light absorption through p-type intersubband transitions. The comments made about the physics of photo-absorption depicted in FIG. 9A and FIG. 9B, also apply to the physics depicted in FIG. 10A and FIG. 10B.

Figure 11A:
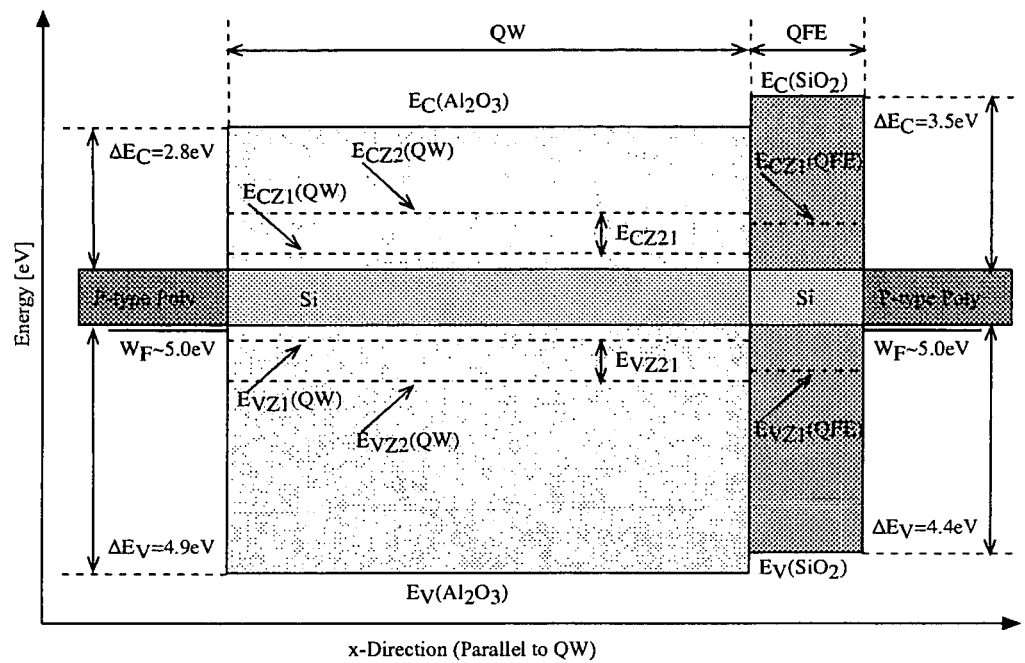
FIG. 11A shows the band diagram for the structure of FIG. 2A, for the "flat-band condition", in which the "conductor" is p-type poly-Si.
Figure 11B:
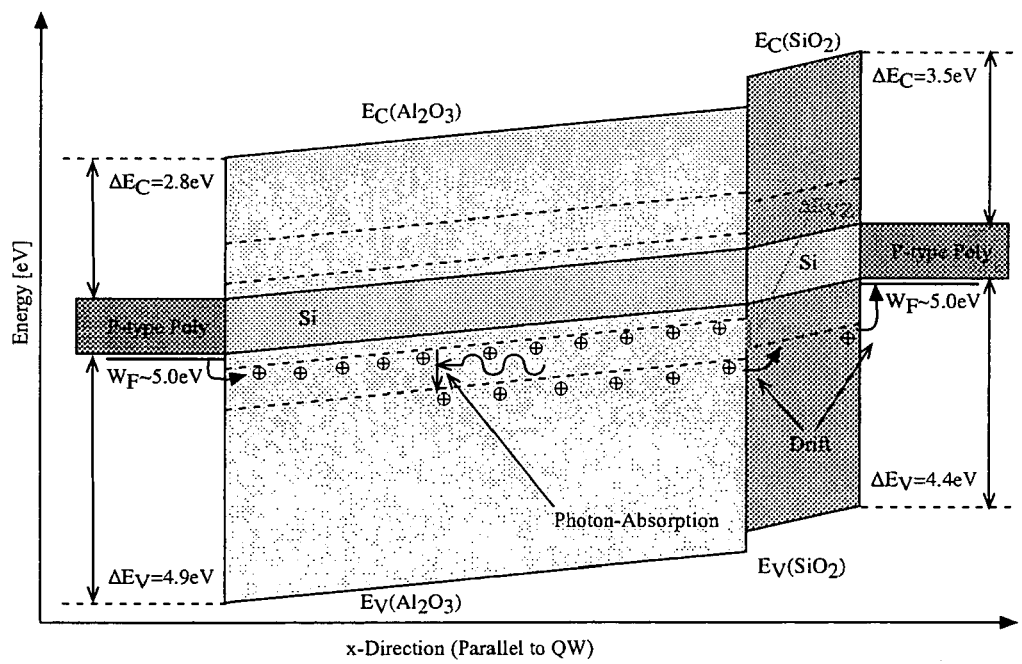
FIG. 11B shows the band diagram of the same structure when voltage is applied for light absorption through p-type intersubband transitions.

FIG. 11A, shows the band diagram for the structure of FIG. 2A, for the "flat-band condition", in which the "conductor" is p-type poly-Si. FIG. 11B shows the band diagram of the same structure when voltage is applied for light absorption through p-type intersubband transitions. With p-type poly-Si as the "conductor", it is not possible to have efficient injection and extraction of electrons, and therefore it is not possible to have light absorption through n-type intersubband transitions. The comments made about the physics of photo-absorption depicted in FIG. 9A and FIG. 9B, also apply to the physics depicted in FIG. 11A and FIG. 11B.

Figure 12A:
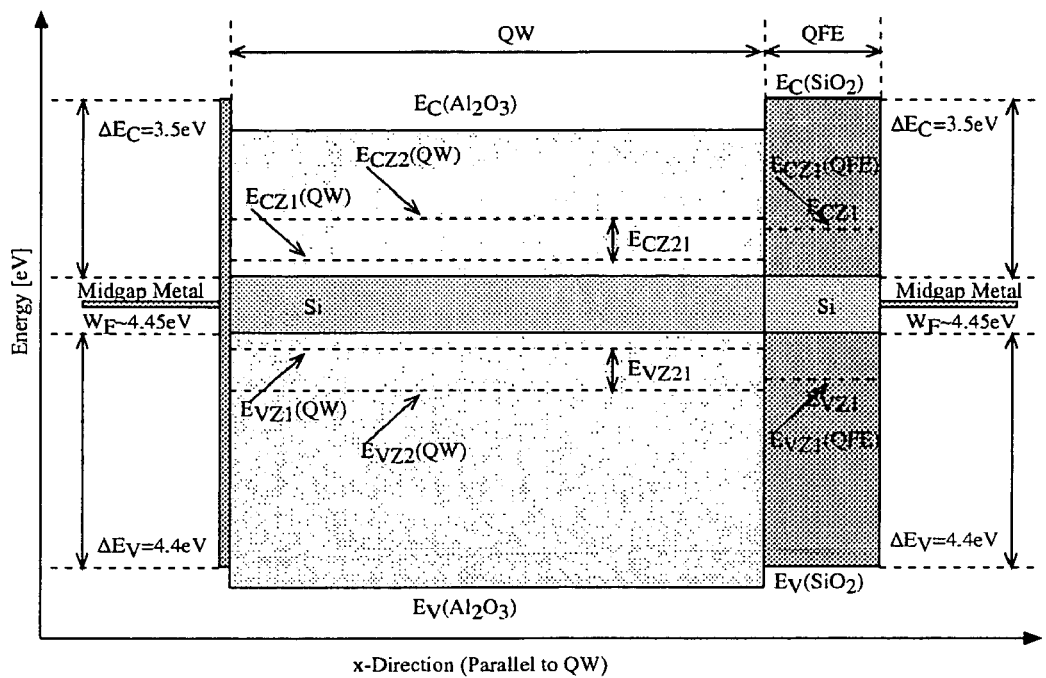
FIG. 12A shows the band diagram for the structure of FIG. 3A, for the "flat-band condition", in which the "conductor" is a metal with midgap work-function.
Figure 12B:
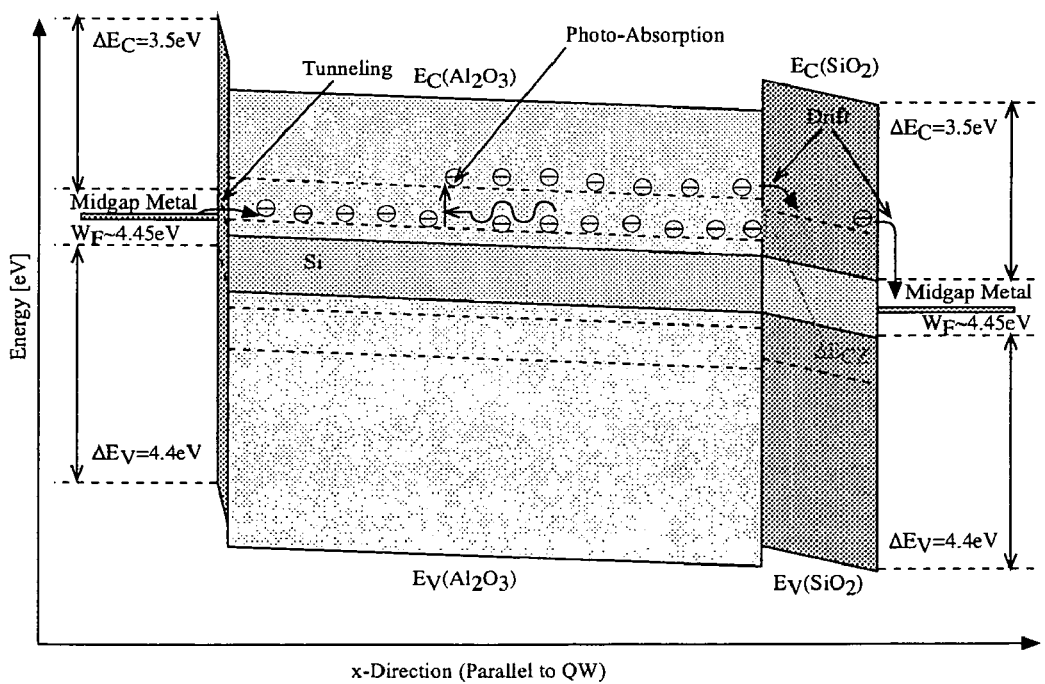
FIGS. 12B-12C show band diagrams of the same structure and same metal, when voltage is applied for light absorption through n-type intersubband transitions, and p-type intersubband transitions, respectively.
Figure 12C:
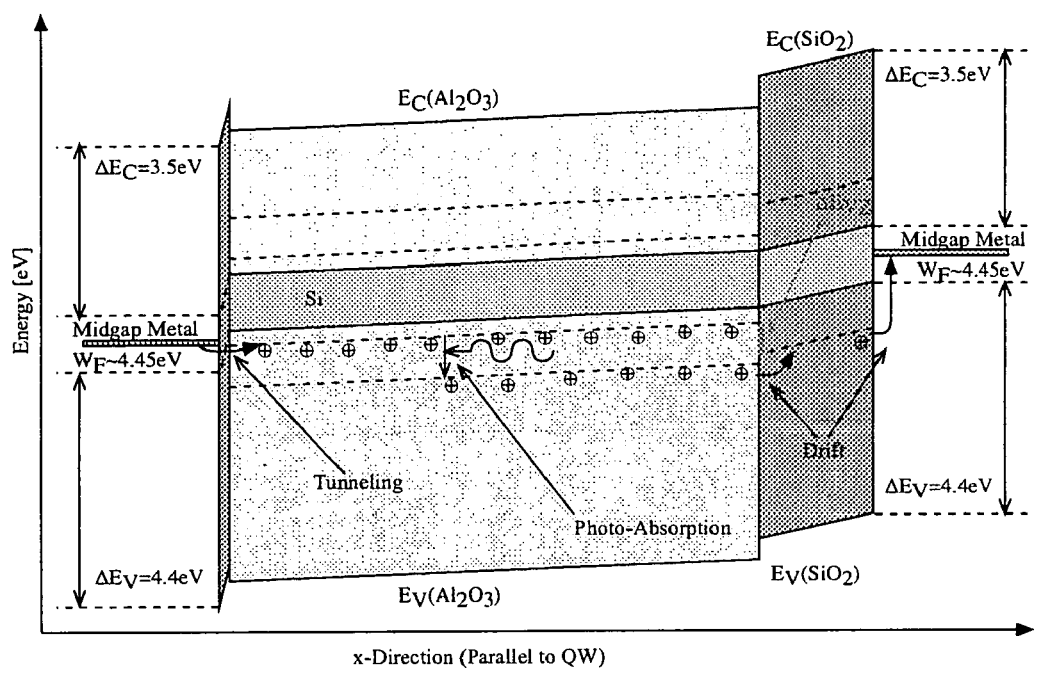

FIG. 12A, shows the band diagram for the structure of FIG. 3A, for the "flat-band condition", in which the "conductor" is a metal with midgap work-function. FIGS. 12B and 12C, show band diagrams of the same structure and same metal, when voltage is applied for light absorption through n-type intersubband transitions, and p-type intersubband transitions, respectively. With this arrangement, the physics of the photo-absorption process, as well as the mechanism for charge carrier extraction, shown in FIGS. 12A, 12B, and 12C, are identical to those depicted in FIGS. 9A, 9B, and 9C, respectively. What is different is the injection of carriers into the lower energy subbands, which is no longer "thermionic field emission", but tunneling from a 3D reservoir, into a subband of quantum well and/or superlattice. This arrangement solves the shortcomings of thermionic field emission injection, shown in FIGS. 9A, 9B, 9C.

Figure 13A:
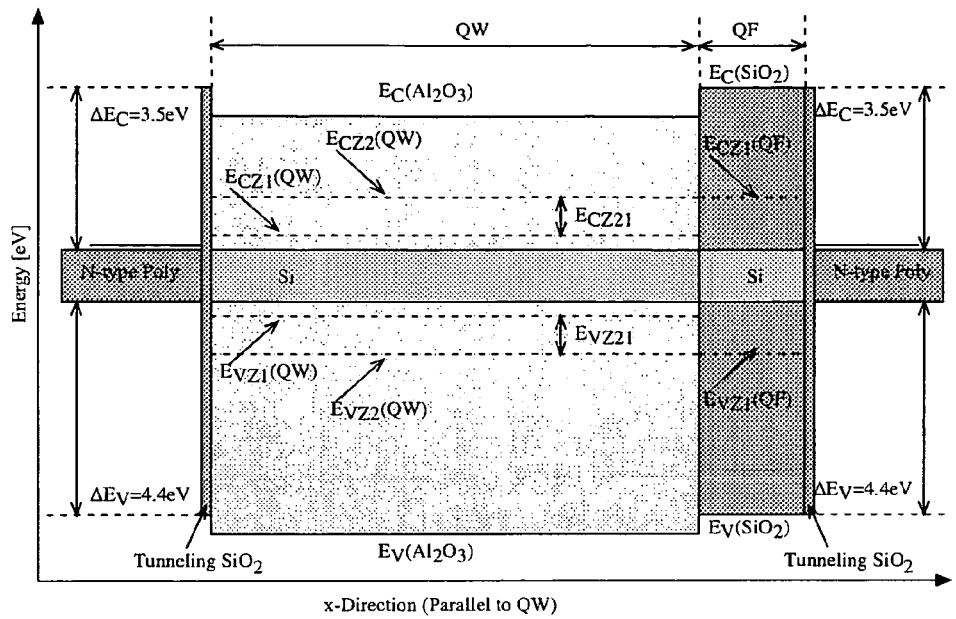
FIGS. 13A-13C are band diagrams showing that the "Quantum Film" contact can, under the suitable applied voltage (magnitude and polarity), act as an "Extractor" for photo-absorption through n-type intersubband transitions as shown in FIG. 13B, or act as an "Injector" for photo-emission through n-type intersubband transitions as shown FIG. 13C.
Figure 13B:
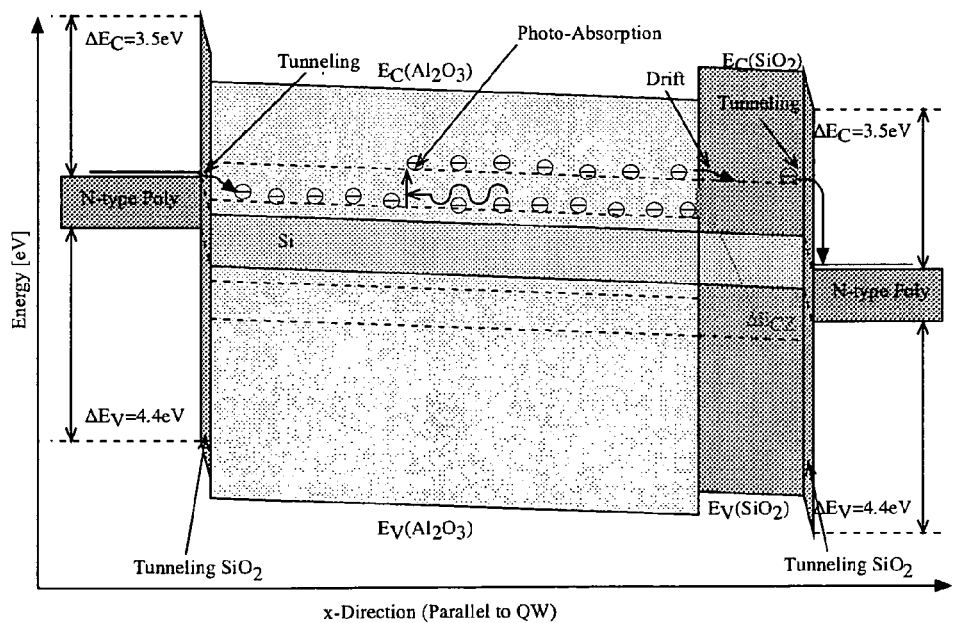
Figure 13C:
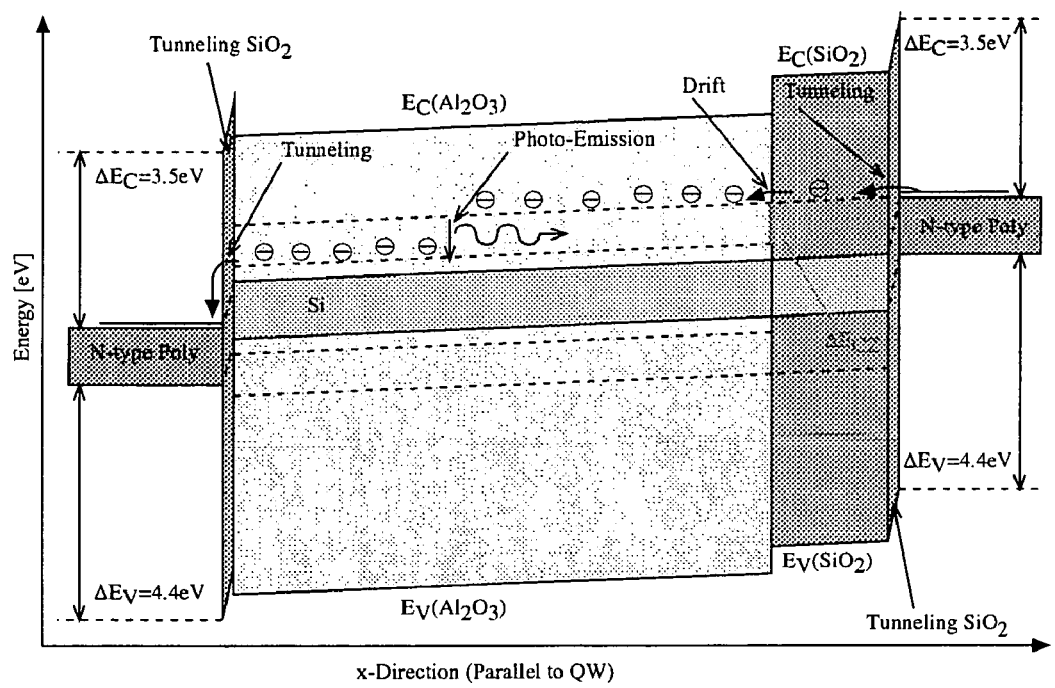

FIG. 13A, shows the band diagram for the structure of FIG. 4A, for the "flat-band condition", in which the "conductor" is n-type poly-Si. FIG. 13B shows the band diagram of the same structure when voltage is applied for light absorption through n-type intersubband transitions. With n-type poly-Si as the "conductor", it is not possible to have efficient injection and extraction of holes, and therefore it is not possible to have light absorption through p-type intersubband transitions. FIG. 13C shows the band diagram of the same structure when voltage is applied for light emission through n-type intersubband transitions. With n-type poly-Si as the "conductor", it is not possible to have efficient injection and extraction of holes, and therefore it is not possible to have light emission through p-type intersubband transitions.

FIGS. 13A, 13B, 13C, show that the "Quantum Film" contact can, under the suitable applied voltage (magnitude and polarity), act as an "Extractor" for photo-absorption through n-type intersubband transitions as shown in FIG. 13B, or act as an "Injector" for photo-emission through n-type intersubband transitions as shown FIG. 13C.

For photo-absorption, electrons are injected from the contact opposite to the "Quantum Film" into the lowest subband. Electrons are injected from the n-poly Si layer, tunneling through an ultra-thin insulator layer, such as SiO2, into the lowest subband of the quantum well (ECZ1). Electrons that do not absorb a photon are driven by the lateral electric field towards the "Quantum Film", but cannot cross it because the z-component of their energy is much lower than the energy barrier denoted as ΔECZ, which is defined as |ΔECZ|=|ECZ1(QF)−ECZ1(QW)|. The barrier ΔECZ blocks the "dark current", and only electrons that absorb a photon can be promoted to the excited subband in the quantum well (ECZ2), and thus have a z-component of their energy large enough to cross into the quantum film, and be collected by the adjacent n-poly Si layer, by tunneling through the ultra-thin SiO2 film.

For photo-emission, electrons are injected into the quantum film from the n-poly Si adjacent to it, by tunneling through an ultra-thin SiO2. Only electrons with a z-component of their energy larger than the lowest subband of the quantum film (ECZ1(QF)), can be injected into the quantum film. Those electrons that cross into the quantum film, are driven by the lateral electric field towards the quantum well, where due to the alignment between ECZ1(QF) and ECZ2 (QW), can drift further towards the contact opposite to the QW. Inevitably at some point, before reaching said opposite contact, the electrons will undergo scattering events which will take them from the excited subband ECZ2(QW), to the ground subband ECZ1(QW), resulting in photo-emission. Once in the ground subband, the electric field will further drive the electrons towards the contact, and tunnel out onto the n-poly Si, where they are collected.

Figure 14A:
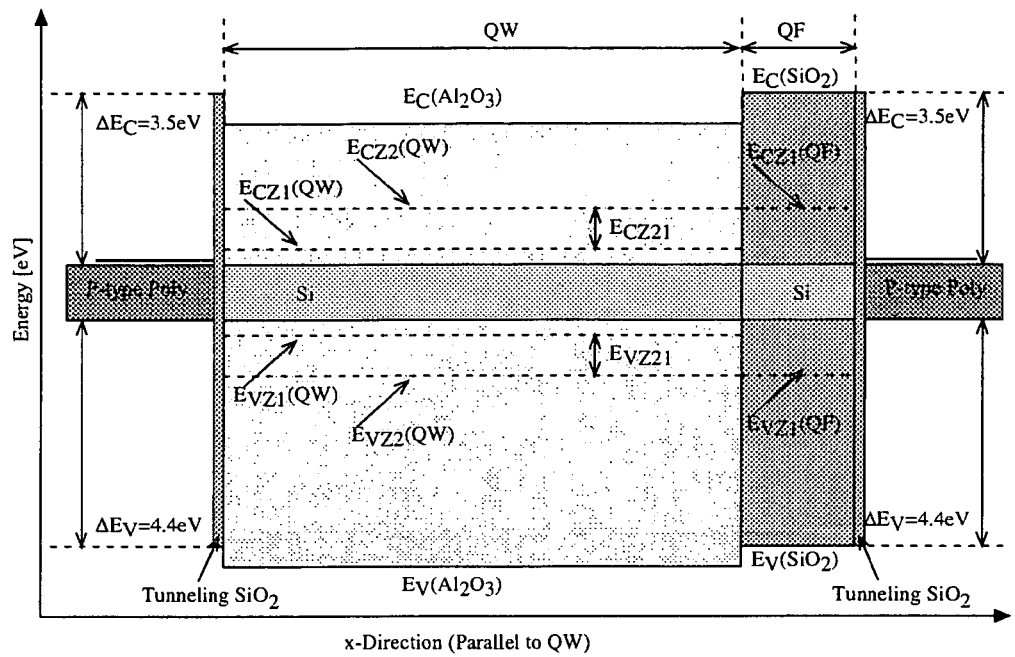
FIG. 14A shows the band diagram for the structure of FIG. 4A for the "flat-band condition" in which the "conductor" is n-type poly-Si.
Figure 14B:
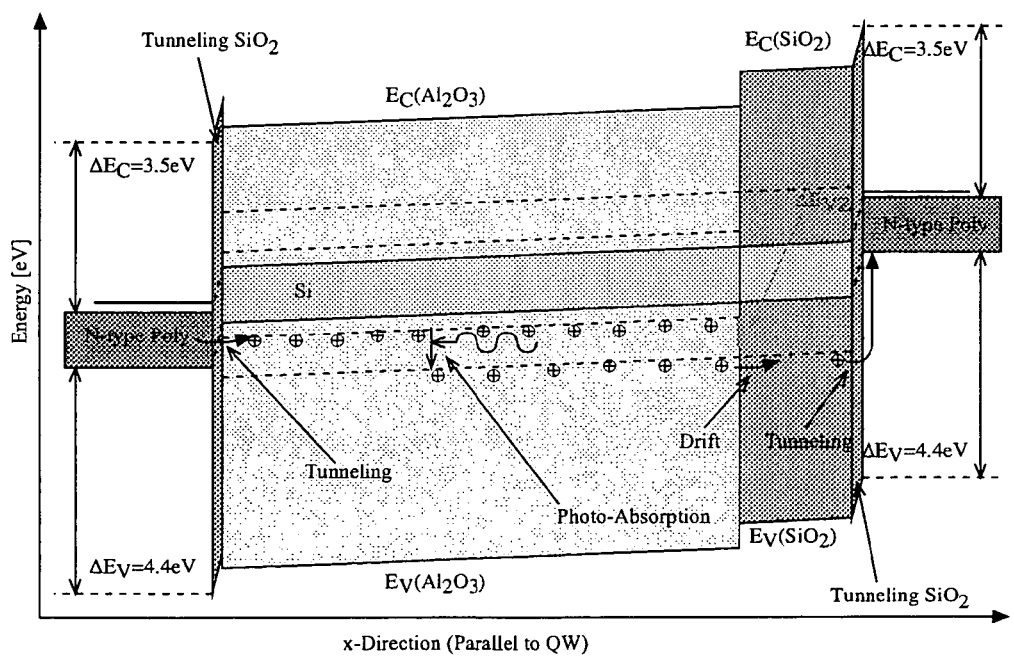
FIG. 14B shows the band diagram of the same structure when voltage is applied for light absorption through p-type intersubband transitions.
Figure 14C:
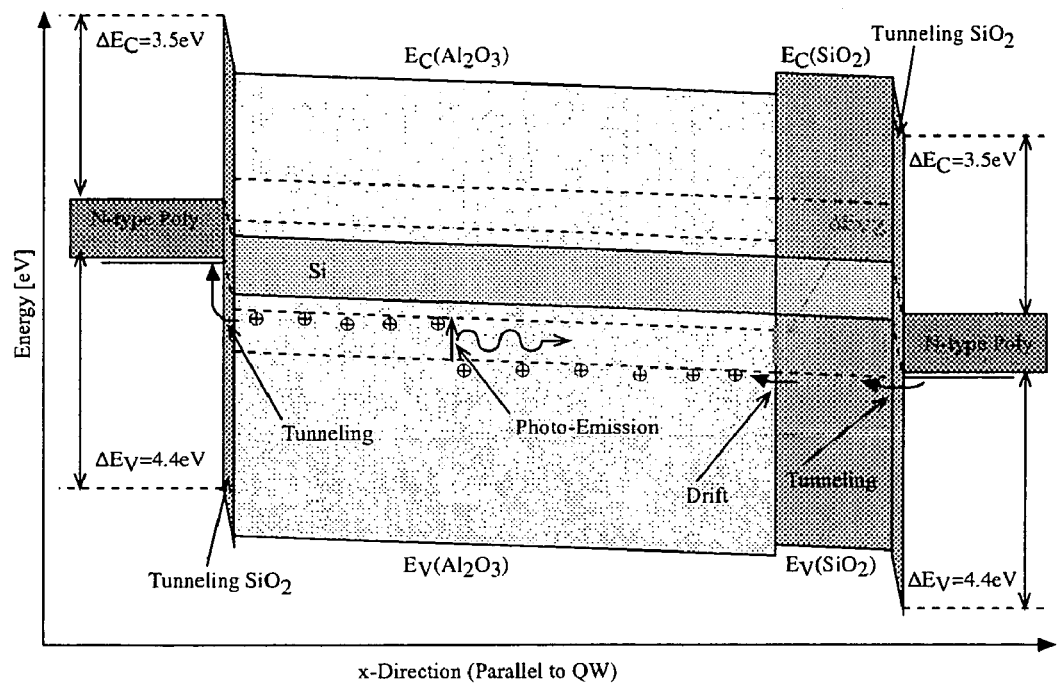
FIG. 14C shows the band diagram of the same structure when voltage is applied for light emission through p-type intersubband transitions.

FIG. 14A, shows the band diagram for the structure of FIG. 4A, for the "flat-band condition", in which the "conductor" is n-type poly-Si. FIG. 14B shows the band diagram of the same structure when voltage is applied for light absorption through p-type intersubband transitions. With p-type poly-Si as the "conductor", it is not possible to have efficient injection and extraction of electrons, and therefore it is not possible to have light absorption through n-type intersubband transitions. FIG. 14C shows the band diagram of the same structure when voltage is applied for light emission through p-type intersubband transitions. With n-type poly-Si as the "conductor", it is not possible to have efficient injection and extraction of electrons, and therefore it is not possible to have light emission through n-type intersubband transitions.

FIGS. 14A, 14B, 14C, show that the "Quantum Film" contact can, under the suitable applied voltage (magnitude and polarity), act as an "Extractor" for photo-absorption through p-type intersubband transitions as shown in FIG. 14B, or act as an "Injector" for photo-emission through p-type intersubband transitions as shown FIG. 14C.

For photo-absorption, holes are injected from the contact opposite to the "Quantum Film" into the lowest subband. Electrons are injected from the p-poly Si layer, tunneling through an ultra-thin insulator layer, such as SiO2, into the lowest subband of the quantum well (EVZ1). Holes that do not absorb a photon are driven by the lateral electric field towards the "Quantum Film", but cannot cross it because the z-component of their energy is much lower than the energy barrier denoted as $\Delta EVZ$, which is defined as $|\Delta EVZ|=|EVZ1(QF)-EVZ1(QW)|$. The barrier $\Delta EVZ$ blocks the "dark current", and only holes that absorb a photon can be promoted to the excited subband in the quantum well (EVZ2), and thus have a z-component of their energy large enough to cross into the quantum film, and be collected by the adjacent p-poly Si layer, by tunneling through the ultra-thin SiO2 film.

For photo-emission, holes are injected into the quantum film from the p-poly Si adjacent to it, by tunneling through an ultra-thin SiO2. Only holes with a z-component of their energy larger than the lowest subband of the quantum film (EVZ1(QF)), can be injected into the quantum film. Those holes that cross into the quantum film, are driven by the lateral electric field towards the quantum well, where due to the alignment between EVZ1(QF) and EVZ2(QW), can drift further towards the contact opposite to the QW. Inevitably at some point, before reaching said opposite contact, the holes will undergo scattering events which will take them from the excited subband EVZ2(QW), to the ground subband EVZ1 (QW), resulting in photo-emission. Once in the ground subband, the electric field will further drive the holes towards the contact, and tunnel out onto the p-poly Si, where they are collected.

Impact of Lateral (In-Plane) Electric Field on Device Operation

Regardless of the exact nature of the lateral contacts, the application of voltage between those contacts impacts some physical processes related to opto-electronic transitions in the QWs and/or SLs. The effects of electric fields on the subbands of quantum wells are covered in text books such as [John Davies, "The Physics of Low-Dimensional Semiconductor Structures", Cambridge University Press, 1998, Chapter 7.2.2 pp. 257-260, and Chapter 10.7.4 pp. 404-405].

Among the expected consequences of lateral (in-plane) electric fields are the change in energy of the absorbed and/or emitted photons, as well as the line width of the absorption and/or emission process. The larger the electric field the broader the line width.

These physical effects, induced by the in-plane electric field, can in fact be taken advantage to improve the performance and/or functionality of the device. For example, there will be scenarios in which there is a minimum electric field to insure that the device operates in a certain mode (photon emitter or photon-absorber). However, beyond that minimum, the electric field can be increased, maintaining the same functionality, but changing some characteristics of the absorption or emission processes, such as the energy of the photons absorbed/emitted, and the line width of the opto-electronic transition.

Exemplary Process Flow

A new method of fabrication has been developed for the new Injector and Extractor lateral contacts. The process flow disclosed herein provides exemplary non-obvious methods to fabricate structured sidewall contacts to the lateral edges of the quantum wells and/or superlattices. This process flow shows how to fabricate a "Quantum Wire" lateral contact and a "Quantum Film" lateral contact, both self aligned with the epitaxial quantum wells and barriers. The fabrication of these lateral contacts is non-obvious and non-trivial.

The ideal topology for any of the structures shown in FIGS. 5A to 5F is a radial one, in which one contact is placed at the center of a circle, and the other lateral contact surrounds the outer edge of the circle. This topology makes the devices to be "edgeless".

The figures illustrating the process flow, depict radial cross sections, which appear as rectangular shapes, with one lateral contact on one side and the other contact a the opposite side.

The exemplary process flow disclosed below describes the fabrication of the structure shown in FIG. 5D, which is the device having a more complex set of lateral contacts. The fabrication of any of the other structures requires only small changes and/or additions to the process flow described here.

This process flow assumes an application and device design in which the top and bottom electrodes can be monocrystalline and/or poly-crystalline silicon. The substrate used can be a patterned or unpatterned silicon wafer. In the drawings, the region labeled "Si substrate" could thus be either a portion of a unpatterned silicon wafer, or a pre-selected active area, side-by-side with CMOS circuitry for example. For simplicity sake, it can be assumed that the process flow starts with unpatterned wafers.

In the figures, the thickness and other dimensions of the different layers of different materials are not to scale, for easier understanding of the impact of each process step in the flow.

Figure 5A:
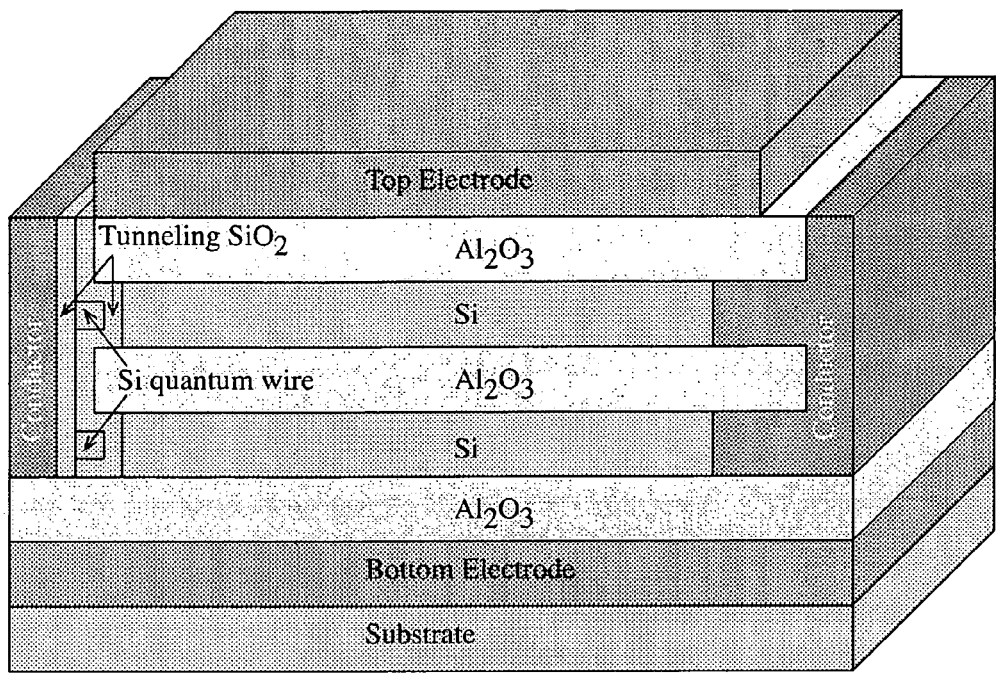
FIGS. 5A-5F illustrate implementations of the lateral contacts of the invention with the addition of Top and Bottom electrodes
Figure 5B:
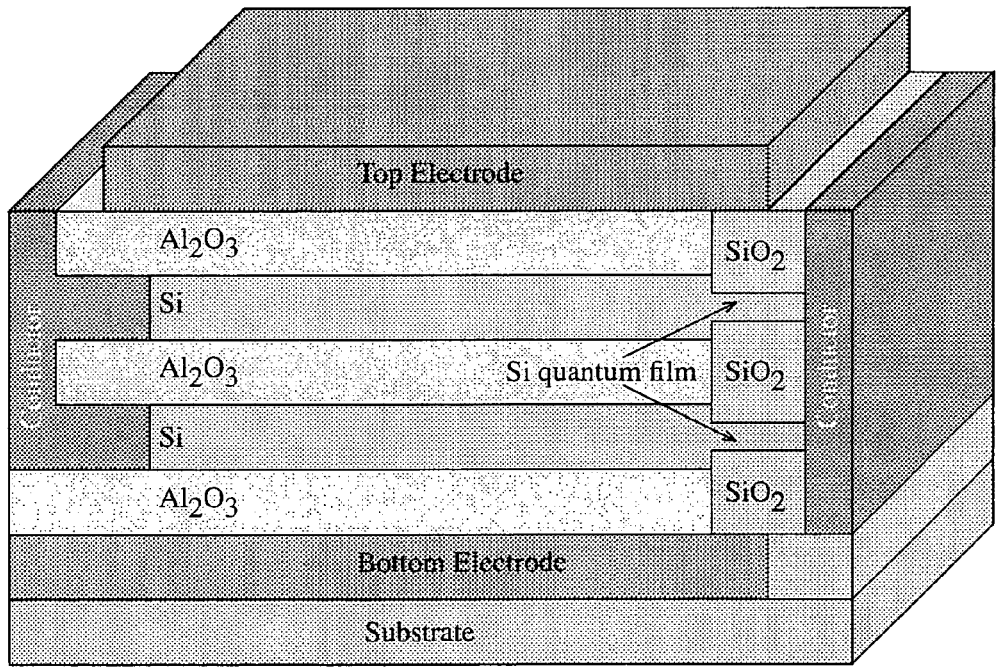
Figure 5C:
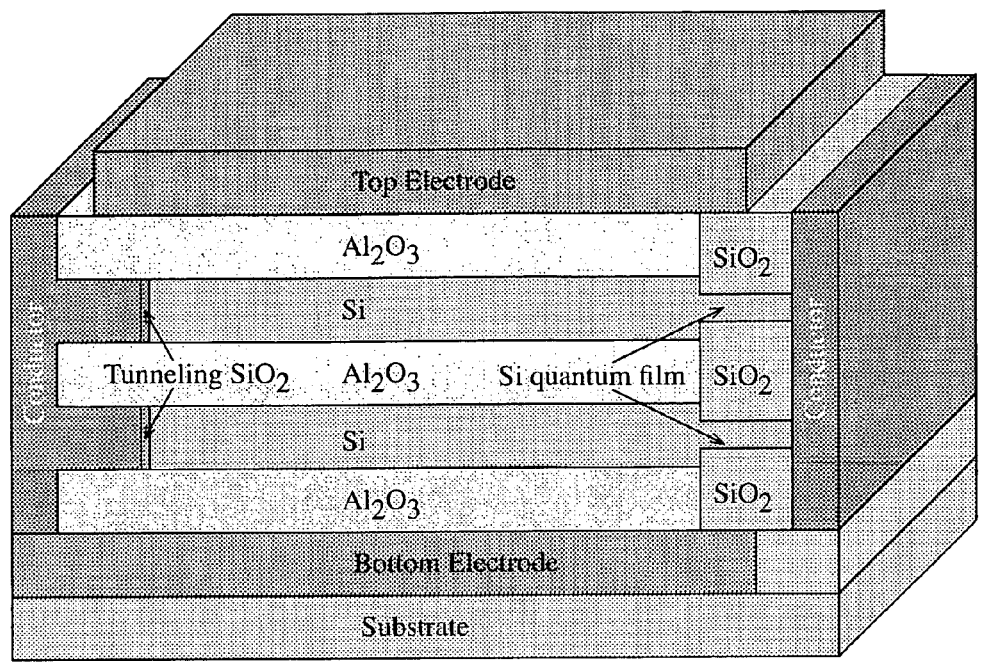
Figure 5D:
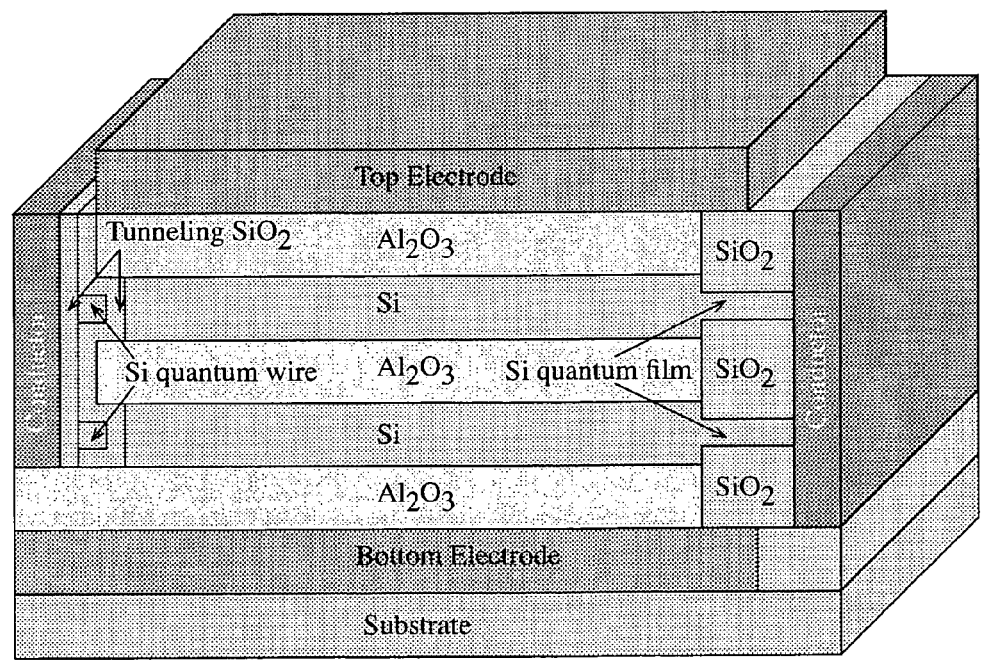
Figure 5E:
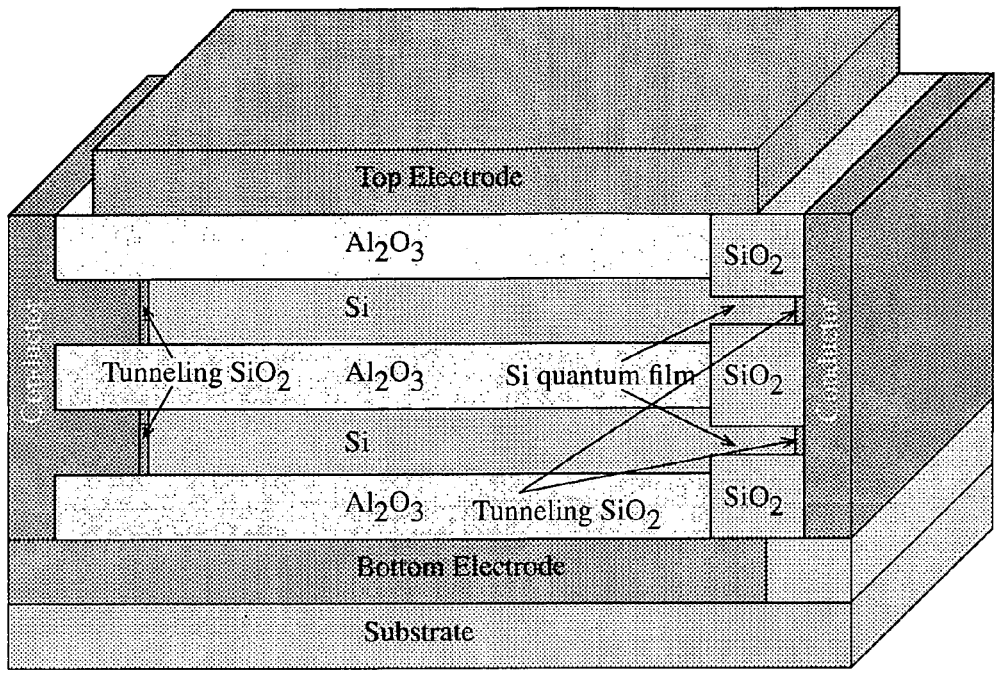
Figure 5F:
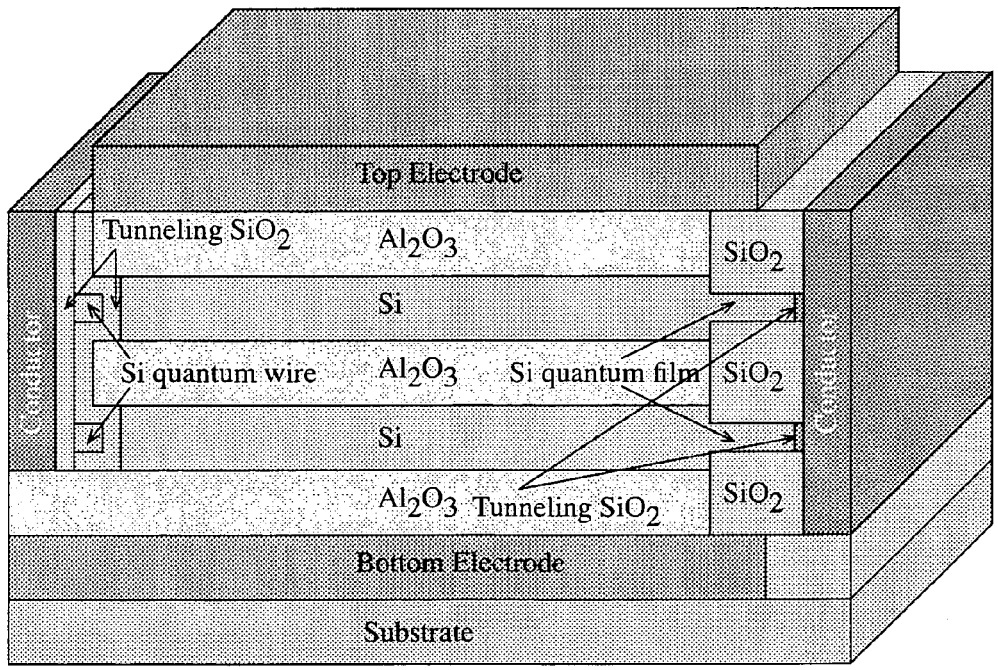
Figure 15A:
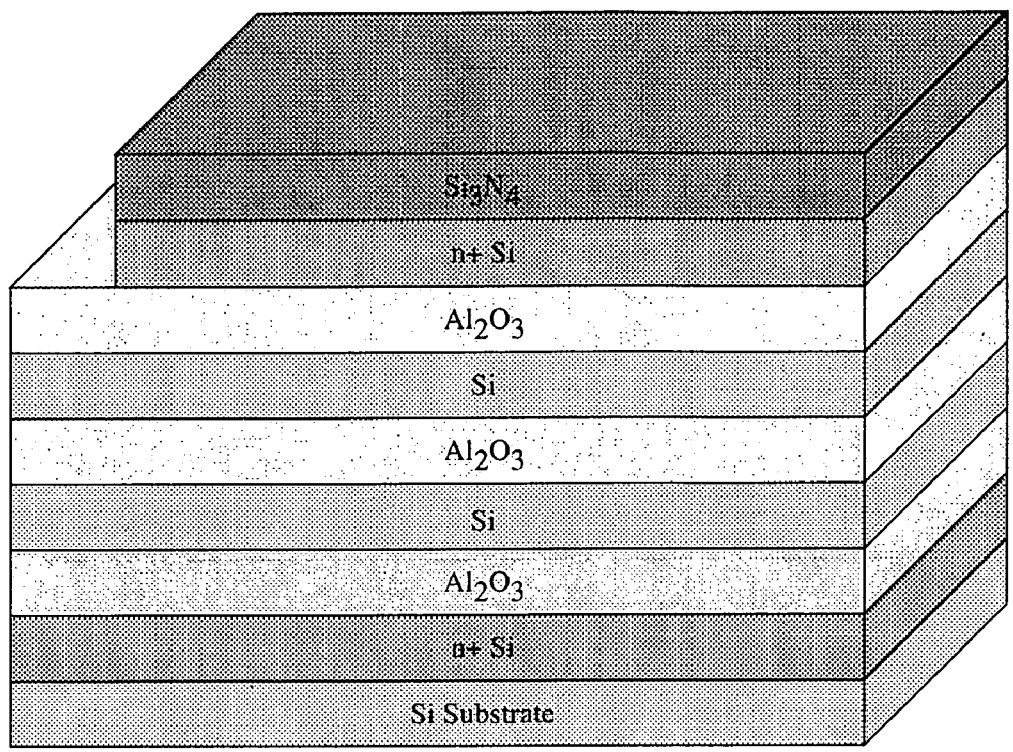
FIGS. 15A-15P illustrate an exemplary sequence of steps for the fabrication of a device structure according to the invention.
Figure 15B:
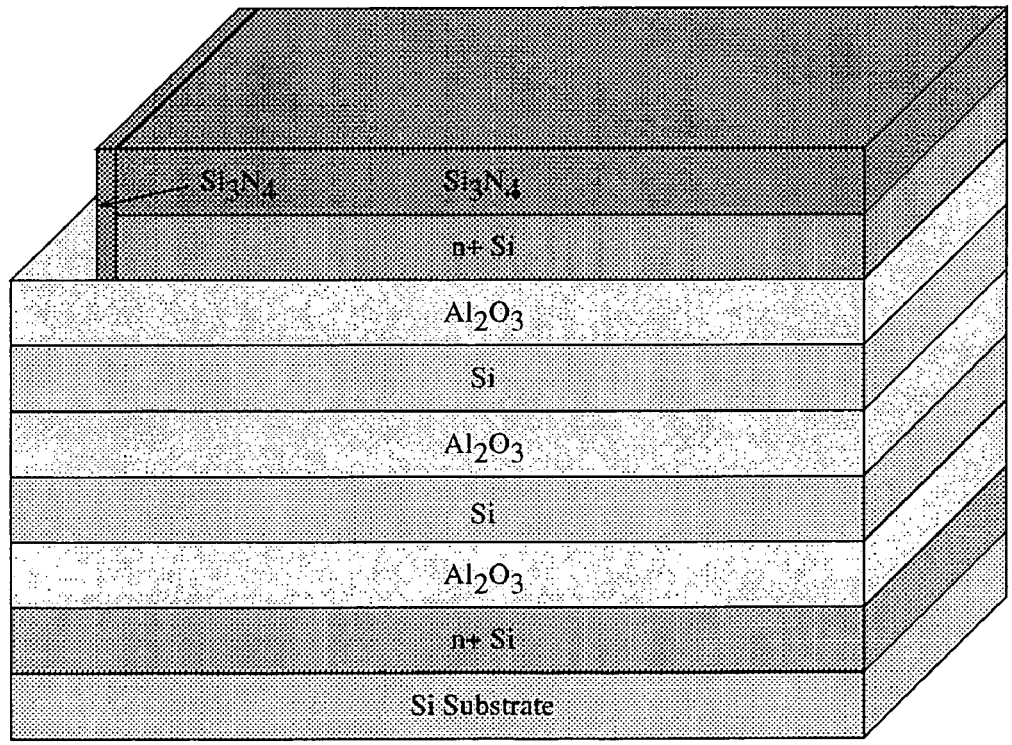
Figure 15C:
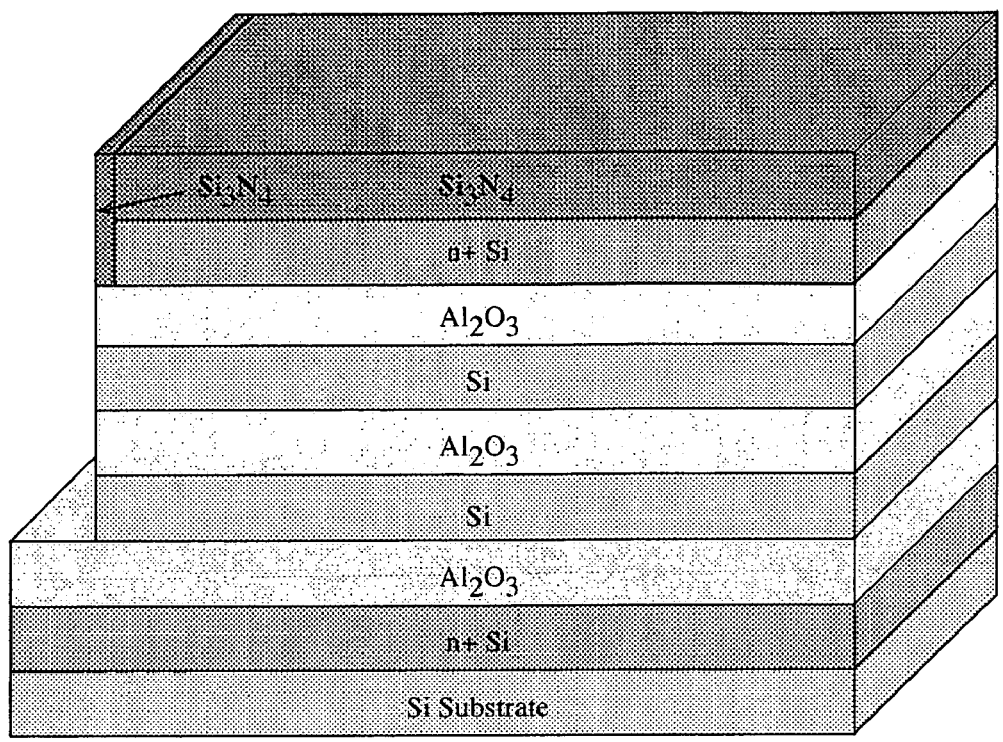
Figure 15D:
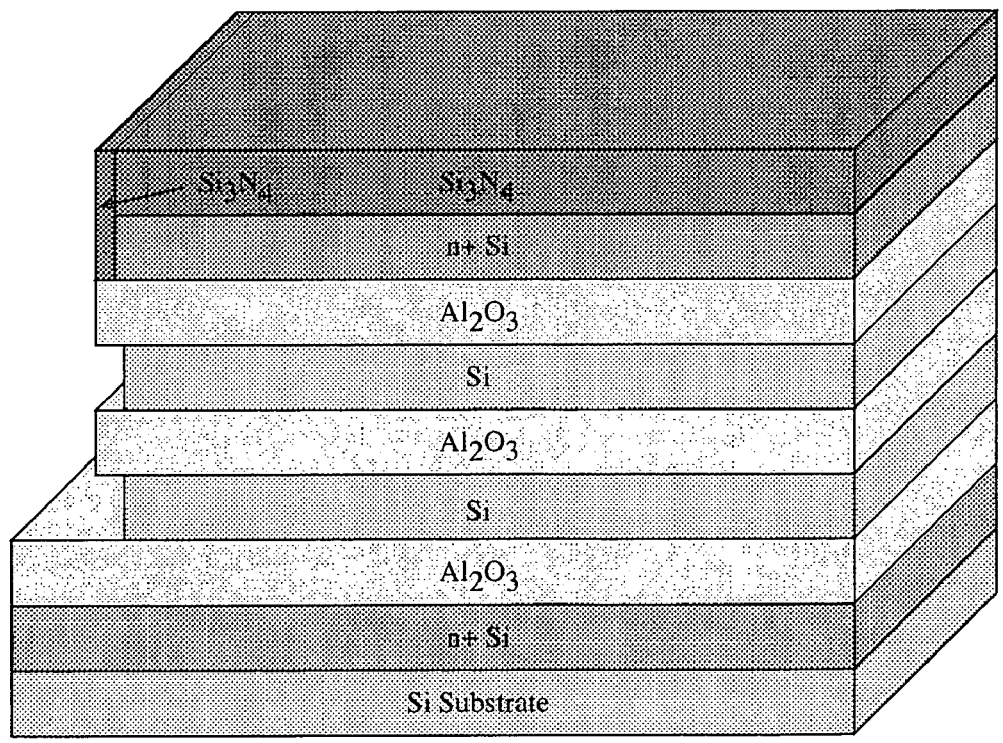
Figure 15E:
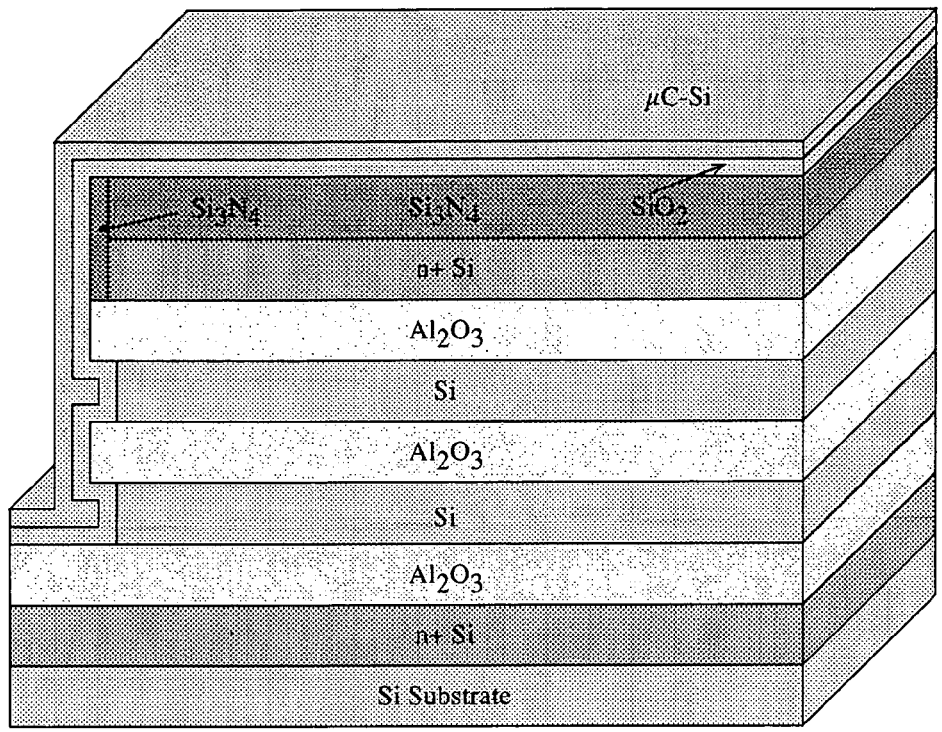
Figure 15F:
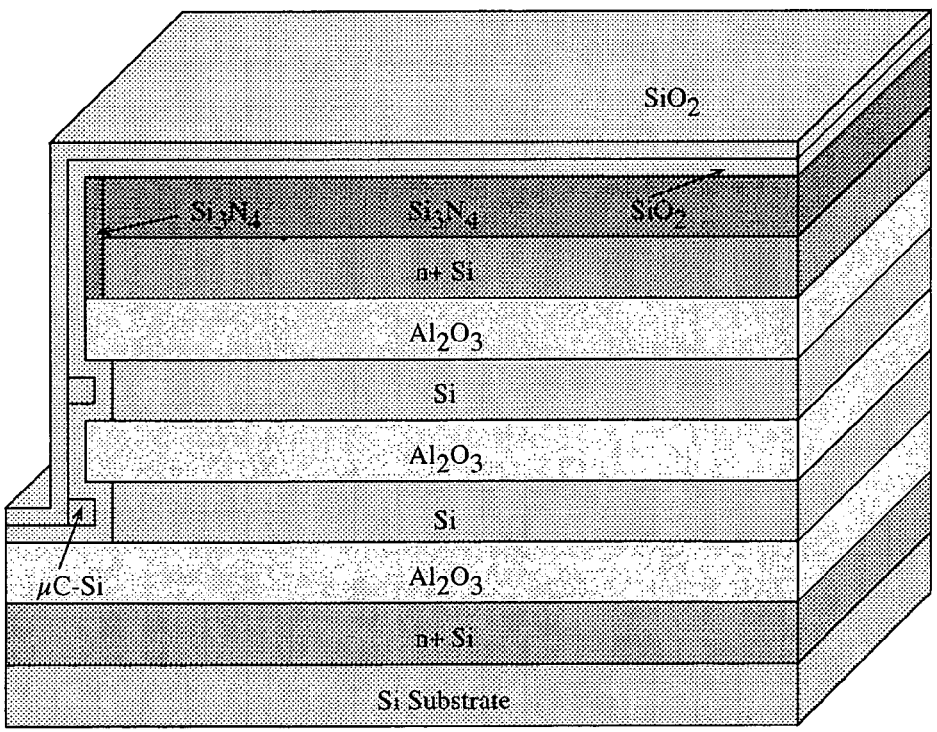
Figure 15G:
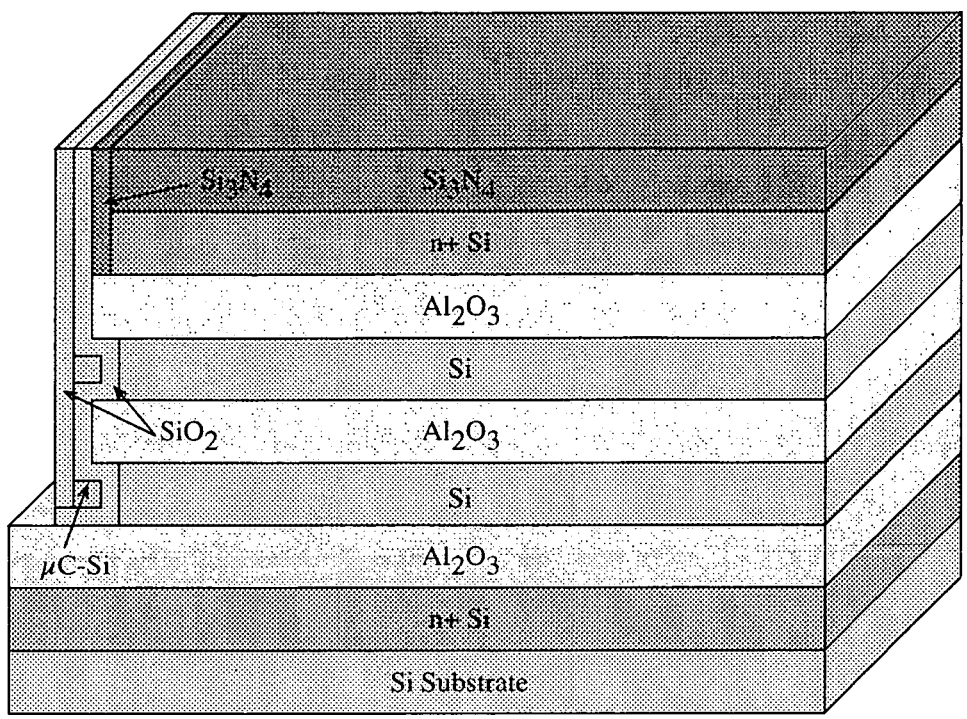
Figure 15H:
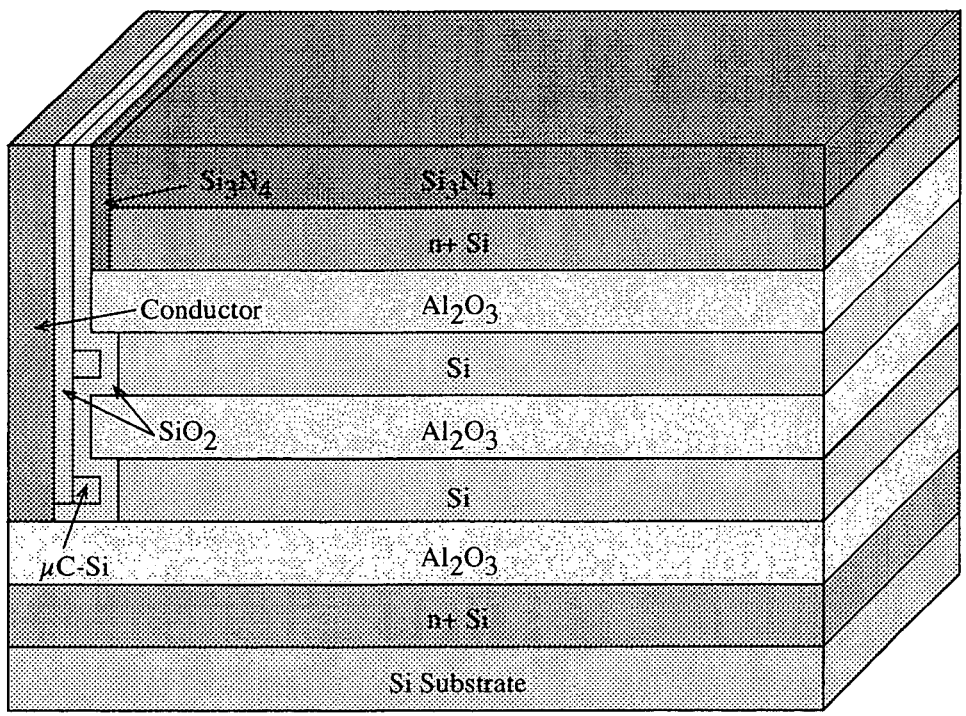
Figure 15I:
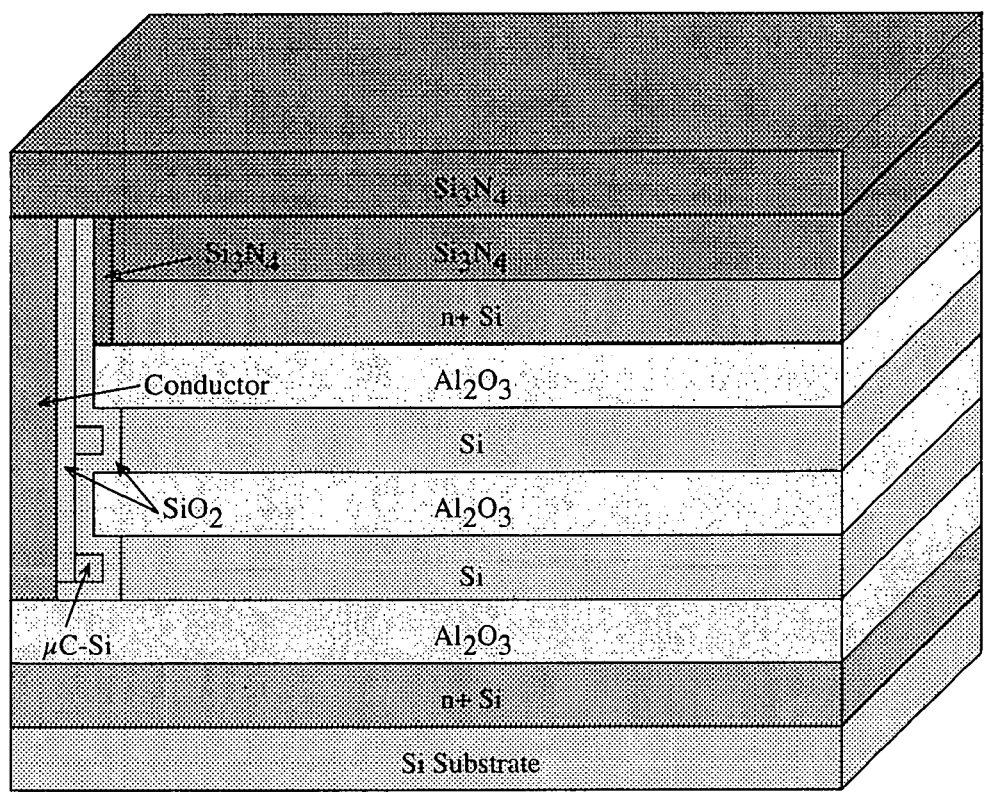
Figure 15J:
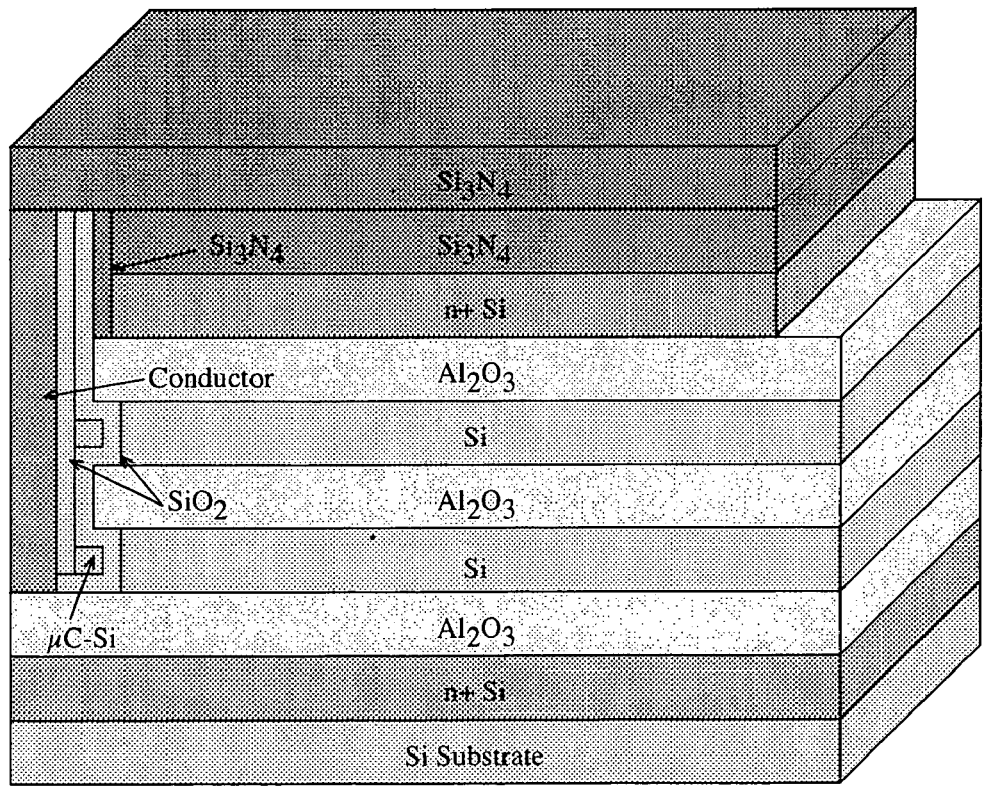
Figure 15K:
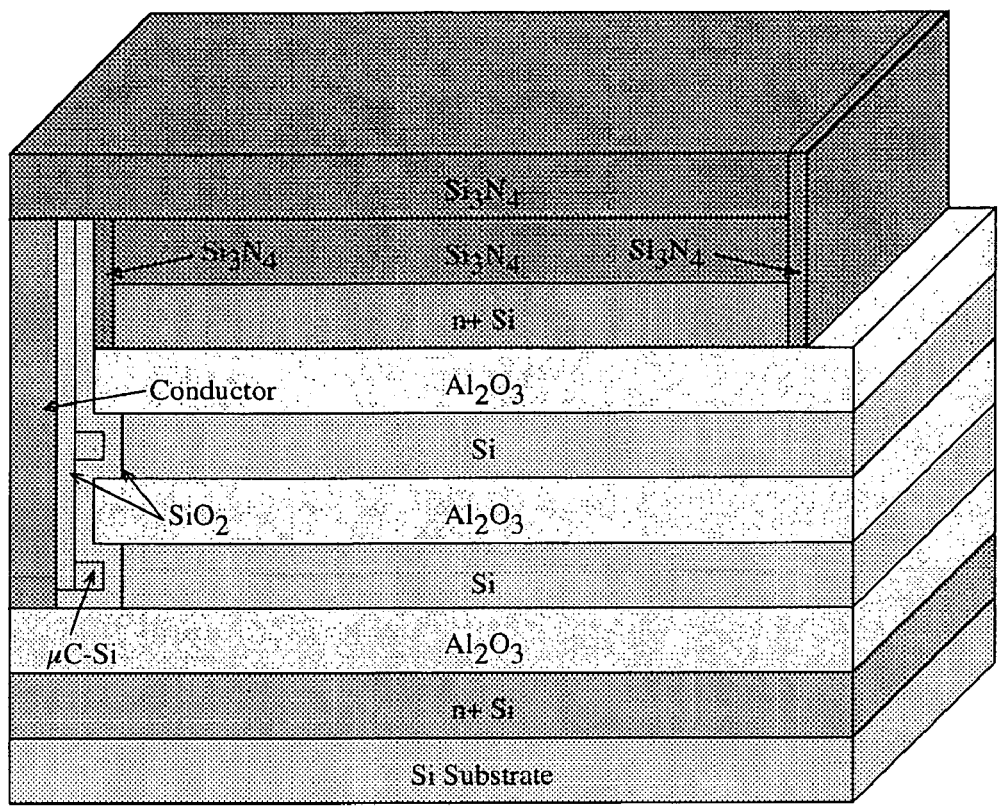
Figure 15L:
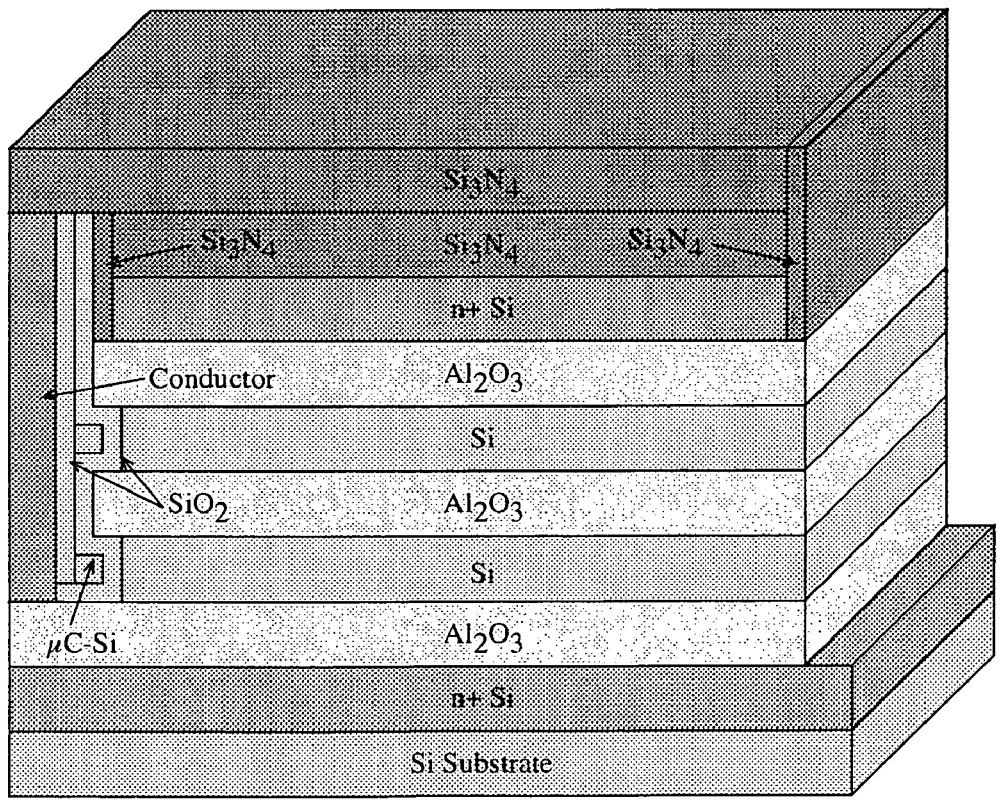
Figure 15M:
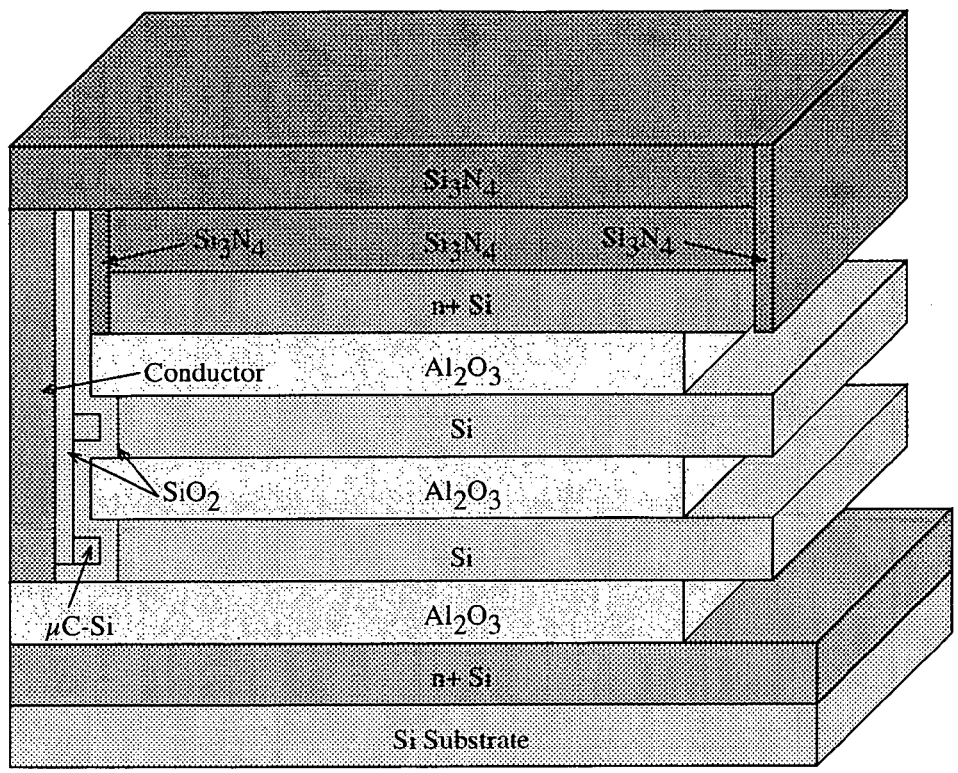
Figure 15N:
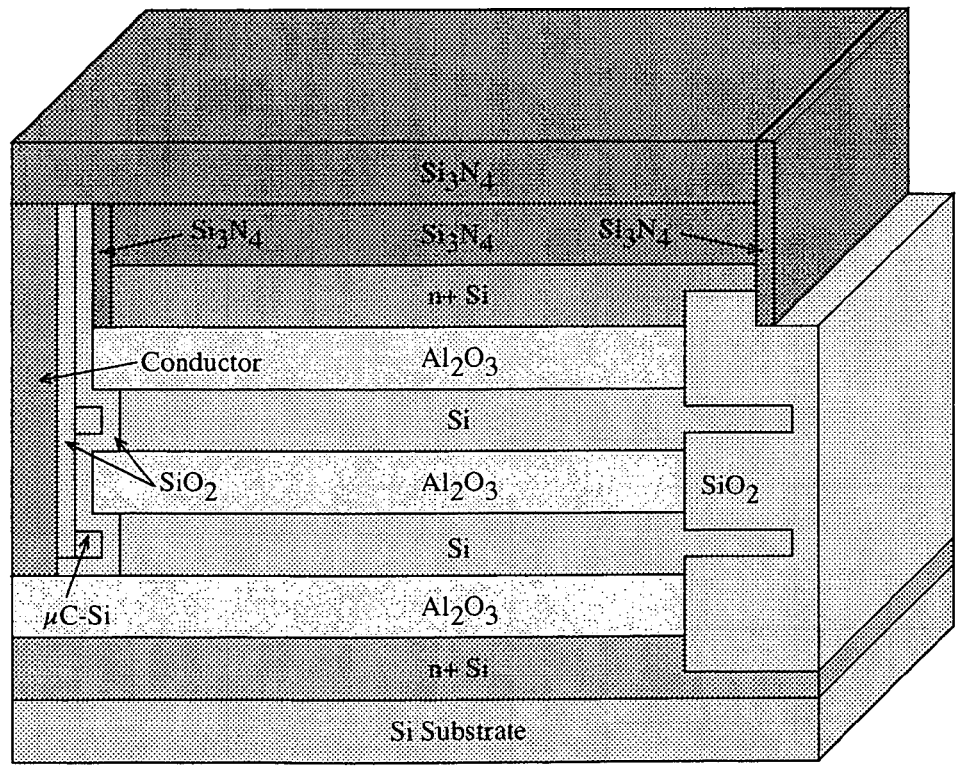
Figure 15O:
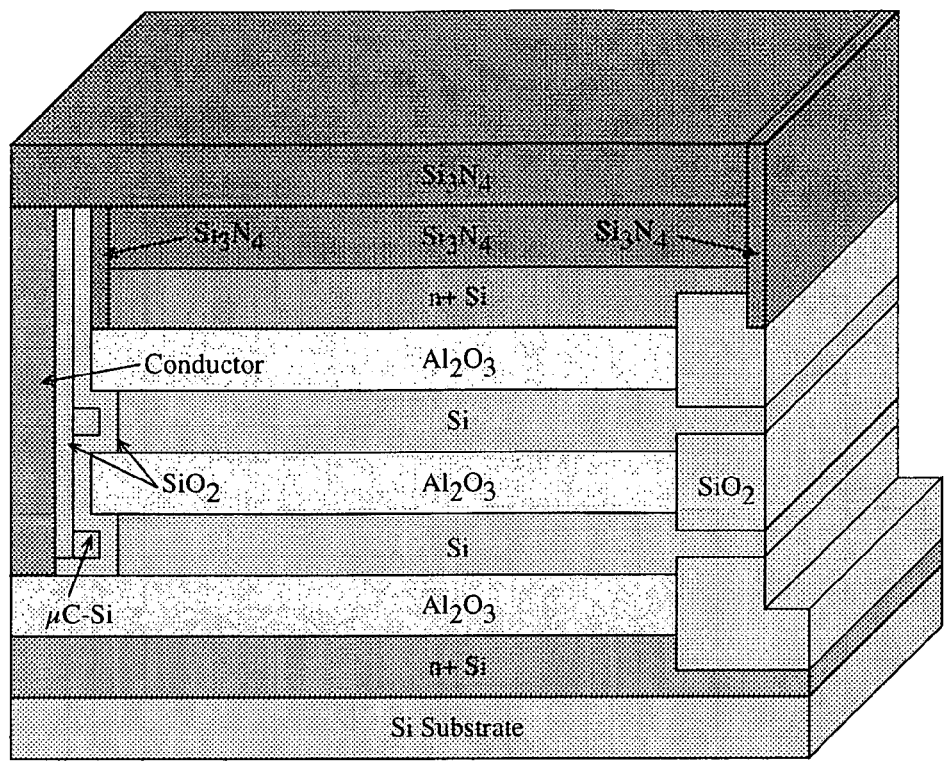
Figure 15P:
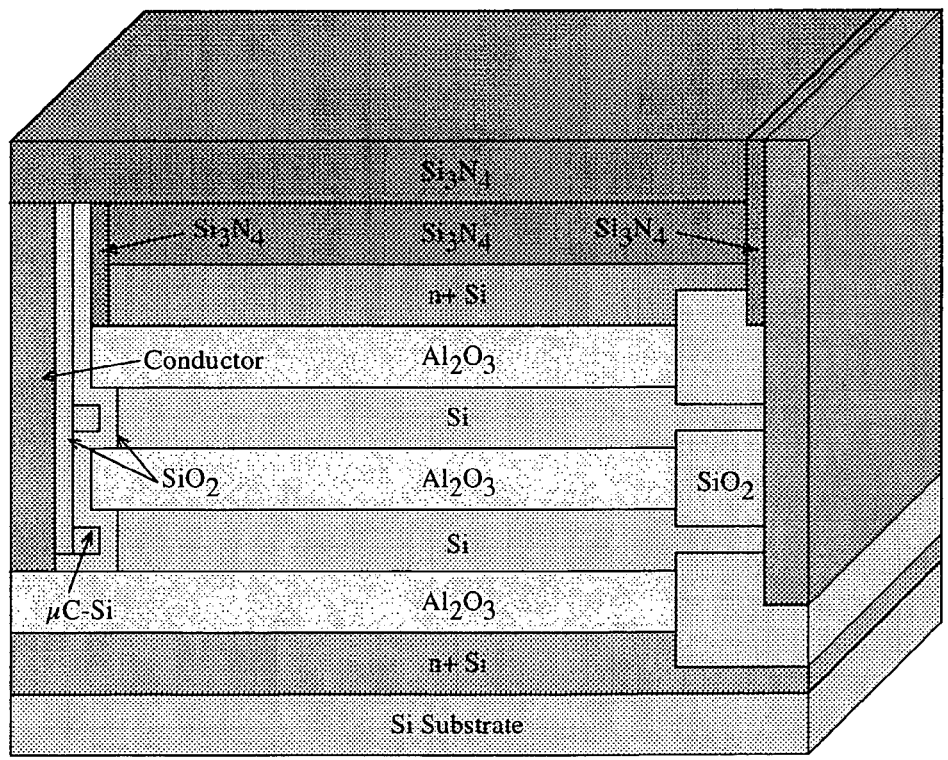

FIGS. 15A to 15P show an exemplary sequence of process steps to fabricate the structure depicted in FIG. 5D.

1. Epitaxial growth of the stack of alternating layers of semiconductor (e.g. Si) and wide bandgap material (e.g. $Al_2O_3$).
2. Deposition of the top electrode layer, which may or may not be epitaxial. For example this layer could be a n-type doped poly-silicon film.
3. Deposition of a hard mask layer, such as silicon nitride ($Si_3N_4$).
4. Patterning of hard mask layer and top electrode, stopping on the top $Al_2O_3$ layer (FIG. 15A),
5. Deposition and etch back of a thin hard mask film such as $Si_3N_4$, to make sidewall spacers, thereby fully encapsulating the top electrode (FIG. 15B),
6. Vertical etch of the epitaxial layers, self-aligned with the top hard mask, stopping on the bottom $Al_2O_3$ layer (FIG. 15C),
7. Isotropic etch of the Si quantum well layers, selectively against $Al_2O_3$ and $Si_3N_4$. The etch time controls how much Si is removed from the quantum wells (FIG. 15D),
8. Deposition of ultra-thin films (a few mono-layers thick) of an insulator, such as $SiO_2$, and of micro-crystalline silicon. Atomic Layer Deposition (ALD) is well known for the ability of depositing such thin films with high degree of conformality (FIG. 15E),
9. Low temperature oxidation of the micro-crystalline silicon film, thereby producing the quantum wires self-aligned with the quantum wells (FIG. 15F),
10. Vertical etch back of the thin $SiO_2$ layers (FIG. 15G).
11. Deposition and etch back of the "conductor" material on the sidewall (FIG. 15H),
12. Deposition of another layer of a hard mask material, such as $Si_3N_4$, thereby fully encapsulating the left hand contact just made (FIG. 15I),
13. Patterning of hard mask layers and top electrode, stopping on the top $Al_2O_3$ layer (FIG. 15J) 14. Deposition and etch back of a thin hard mask film such as $Si_3N_4$, to make sidewall spacers, thereby fully encapsulating the top electrode (FIG. 15K),
15. Vertical etch of the epitaxial layers, self-aligned with the top hard mask, stopping on the surface of the bottom electrode (FIG. 15L),
16. Isotropic etch of the $Al_2O_3$ barrier layers, selectively against Si and $Si_3N_4$. The etch time controls how much $Al_2O_3$ is removed from the barrier layers (FIG. 15M),
17. Low temperature oxidation of the Si quantum well films, which converts part of that silicon into $SiO_2$, thus locally reducing the thickness of the Si quantum well films, thereby producing the "silicon quantum film". At the same time the oxidation process increases fills the empty spaces left by the etching of the $Al_2O_3$ barrier layers (FIG. 15N),
18. Vertical etch of Si and $SiO_2$, selective with respect to $Si_3N_4$, thereby exposing the edges of the silicon quantum films (FIG. 15O),
19. Deposition and etch back of the "conductor" material (FIG. 15P).

What is claimed is:

1. An opto-electronic device comprising:
a crystalline substrate;
an insulator layer coextensive with a top surface of the crystalline substrate;
an epitaxial stack of alternating photon-active semiconductor layers and electrical-insulator layers above a central part of the top surface of the insulator layer;
first contact means formed on a first edge part of the top surface of the insulator layer, said first contact means extending parallel with a direction of epitaxial deposition and being in contact with one side wall of at least one active semiconductor layer for at least one of injecting charge carriers into and extracting charge carriers from the active semiconductor layer(s) associated therewith; and
second contact means formed on a second edge part of the top surface of the insulator layer, said second contact means extending parallel with the direction of epitaxial deposition and being in contact with a second side wall of at least one active semiconductor layer for at least one of extracting charge carriers from and injecting charge carriers into the active semiconductor layer(s) associated therewith;
wherein at least one of said first contact means and said second contact means comprise at least one barrier layer between a conductive material and the semiconductor active layer.

2. An opto-electronic device as claimed in claim 1, wherein said first contact means each comprise a conductor part and another part consisting of a quantum wire surrounded by an insulator extending parallel with the direction of epitaxial deposition of the epitaxial stack, said quantum wire surrounded by said insulator part being located between the conductor part and the side wall of a respective active semiconductor layer for the injecting of the charge carriers into each said active semiconductor layer.

3. An opto-electronic device as claimed in claim 1, wherein said first contact means each comprise a conductor part extending parallel with the direction of epitaxial deposition of the epitaxial stack, said conductor part being in contact at the sidewall with a thinned part of each semiconductor active layer for the injecting of the charge carriers into each said active semiconductor layer.

4. An opto-electronic device as claimed in claim 1, wherein said first contact means each comprise a conductor part and an insulator part extending parallel with the direction of epitaxial deposition of the epitaxial stack, said insulator part being located between said conductor part and the sidewall of each semiconductor active layer for the injecting of the charge carriers into each said active semiconductor layer.

5. An opto-electronic device as claimed in claim 1, wherein said second contact means each comprise a conductor part extending parallel with the direction of epitaxial deposition of the epitaxial stack, said conductor part being in contact at the sidewall with a part of each semiconductor active layer for the at least one of the extracting of the charge carriers from and the injecting of the charge carriers into each said active semiconductor layer.

6. An opto-electronic device as claimed in claim 1, wherein said second contact means each comprise a conductor part and an insulator part extending parallel with the direction of epitaxial deposition of the epitaxial stack, said conductor part being in contact with a thinned part of each semiconductor active layer for the extracting of the charge carriers from each said active semiconductor layer.

7. An opto-electronic device as claimed in claim 1, wherein said second contact means each comprise a conductor part and an insulator part extending parallel with the direction of epitaxial deposition of the epitaxial stack, said insulator part being located between said conductor part and a thinned part of each semiconductor active layer for the extracting of the charge carriers from each said active semiconductor layer.

8. An opto-electronic device as claimed in claim 2, wherein said second contact means each comprise a conductor part extending parallel with the direction of epitaxial deposition of the epitaxial stack, said conductor part being in contact at the sidewall with a part of each semiconductor active layer for the extracting of the charge carriers from each said active semiconductor layer.

9. An opto-electronic device as claimed in claim 2, wherein said second contact means each comprise a conductor part and an insulator part extending parallel with the direction of epitaxial deposition of the epitaxial stack, said conductor part being in contact with a thinned part of each semiconductor active layer for the extracting of the charge carriers from each said active semiconductor layer.

10. An opto-electronic device as claimed in claim 2, wherein said second contact means each comprise a conductor part and an insulator part extending parallel with the direction of epitaxial deposition of the epitaxial stack, said insulator part being located between said conductor part and a thinned part of each semiconductor active layer for the extracting of the charge carriers from each said active semiconductor layer.

11. An opto-electronic device as claimed in claim 3, wherein said second contact means each comprise a conductor part extending parallel with the direction of epitaxial deposition of the epitaxial stack, said conductor part being in contact at the sidewall with a part of each semiconductor active layer for the extracting of the charge carriers from each said active semiconductor layer.

12. An opto-electronic device as claimed in claim 3, wherein said second contact means each comprise a conductor part and an insulator part extending parallel with the direction of epitaxial deposition of the epitaxial stack, said conductor part being in contact with a thinned part of each semiconductor active layer for the extracting of the charge carriers from each said active semiconductor layer.

13. An opto-electronic device as claimed in claim 3, wherein said second contact means each comprise a conductor part and an insulator part extending parallel with the direction of epitaxial deposition of the epitaxial stack, said insulator part being located between said conductor part and a thinned part of each semiconductor active layer for the extracting of the charge carriers from each said active semiconductor layer.

14. An opto-electronic device as claimed in claim 4, wherein said second contact means each comprise a conductor part extending parallel with the direction of epitaxial deposition of the epitaxial stack, said conductor part being in contact at the sidewall with a part of each semiconductor active layer for the extracting of the charge carriers from each said active semiconductor layer.

15. An opto-electronic device as claimed in claim 4, wherein said second contact means each comprise a conductor part and an insulator part extending parallel with the direction of epitaxial deposition of the epitaxial stack, said conductor part being in contact with a thinned part of each semiconductor active layer for the extracting of the charge carriers from each said active semiconductor layer.

16. An opto-electronic device as claimed in claim 4, wherein said second contact means each comprise a conductor part and an insulator part extending parallel with the direction of epitaxial deposition of the epitaxial stack, said insulator part being located between said conductor part and a thinned part of each semiconductor active layer for the extracting of the charge carriers from each said active semiconductor layer.

17. An opto-electronic device as claimed in claim 1, wherein the substrate and each active semiconductor layer is comprised of a silicon-compatible alloy compound.

18. An opto-electronic device as claimed in claim 1, wherein the substrate and each active semiconductor layer is comprised of a germanium-compatible alloy compound.

19. An opto-electronic device as claimed in claim 1, wherein the active semiconductor layers include quantum wells.

20. An opto-electronic device as claimed in claim 1, wherein the active semiconductor layers include short period superlattices.

21. An opto-electronic device comprising:
a crystalline substrate;
a bottom electrode on the top surface of the crystalline substrate;
an insulator layer on the top surface of the bottom electrode;
an epitaxial stack of alternating photon-active semiconductor layers and electrical-insulator layers above a central part of the top surface of the insulator layer;
first contact means formed on a first edge part of the top surface of the insulator layer, said first contact means extending parallel with a direction of epitaxial deposition and being in contact with one side wall of at least one active semiconductor layer for at least one of injecting charge carriers into and extracting charge carriers from the active semiconductor layer(s) associated therewith;
second contact means formed on a second edge part of the top surface of the insulator layer, said second contact means extending parallel with the direction of epitaxial deposition and being in contact with a second side wall of at least one active semiconductor layer for at least one of extracting charge carriers from and injecting charge carriers into the active semiconductor layer(s) associated therewith; and
a top electrode on the top surface of the upper layer of the epitaxial stack:
wherein at least one of said first contact means and said second contact means interfaces with at least one semiconductor active layer region with reduced thickness with respect to its thickness at a center of the device.

22. An opto-electronic device as claimed in claim 21, wherein said first contact means each comprise a conductor part and another part consisting of a quantum wire surrounded by an insulator extending parallel with the direction of epitaxial deposition of the epitaxial stack, said quantum wire surrounded by said insulator part being located between the conductor part and the side wall of a respective active semiconductor layer for the injecting of the charge carriers into each said active semiconductor layer.

23. An opto-electronic device as claimed in claim 21, wherein said first contact means each comprise a conductor part extending parallel with the direction of epitaxial deposition of the epitaxial stack, said conductor part being in contact at the sidewall with a thinned part of each semiconductor active layer for the injecting of the charge carriers into each said active semiconductor layer.

24. An opto-electronic device as claimed in claim 21, wherein said first contact means each comprise a conductor part and an insulator part extending parallel with the direction of epitaxial deposition of the epitaxial stack, said insulator part being located between said conductor part and the sidewall of each semiconductor active layer for the injecting of the charge carriers into each said active semiconductor layer.

25. An opto-electronic device as claimed in claim 22, wherein said second contact means each comprise a conductor part extending parallel with the direction of epitaxial deposition of the epitaxial stack, said conductor part being in contact at the sidewall with a part of each semiconductor active layer for the extracting of the charge carriers from each said active semiconductor layer.

26. An opto-electronic device as claimed in claim 22, wherein said second contact means each comprise a conductor part and an insulator part extending parallel with the direction of epitaxial deposition of the epitaxial stack, said conductor part being in contact with a thinned part of each semiconductor active layer for the extracting of the charge carriers from each said active semiconductor layer.

27. An opto-electronic device as claimed in claim 22, wherein said second contact means each comprise a conductor part and an insulator part extending parallel with the direction of epitaxial deposition of the epitaxial stack, said insulator part being located between said conductor part and a thinned part of each semiconductor active layer for the extracting of the charge carriers from each said active semiconductor layer.

28. An opto-electronic device as claimed in claim 23, wherein said second contact means each comprise a conductor part extending parallel with the direction of epitaxial deposition of the epitaxial stack, said conductor part being in contact at the sidewall with a part of each semiconductor active layer for the extracting of the charge carriers from each said active semiconductor layer.

29. An opto-electronic device as claimed in claim 23, wherein said second contact means each comprise a conductor part and an insulator part extending parallel with the direction of epitaxial deposition of the epitaxial stack, said conductor part being in contact with a thinned part of each semiconductor active layer for the extracting of the charge carriers from each said active semiconductor layer.

30. An opto-electronic device as claimed in claim 23, wherein said second contact means each comprise a conductor part and an insulator part extending parallel with the direction of epitaxial deposition of the epitaxial stack, said insulator part being located between said conductor part and a thinned part of each semiconductor active layer for the extracting of the charge carriers from each said active semiconductor layer.

31. An opto-electronic device as claimed in claim 24, wherein said second contact means each comprise a conductor part extending parallel with the direction of epitaxial deposition of the epitaxial stack, said conductor part being in contact at the sidewall with a part of each semiconductor active layer for the extracting of the charge carriers from each said active semiconductor layer.

32. An opto-electronic device as claimed in claim 24, wherein said second contact means each comprise a conductor part and an insulator part extending parallel with the direction of epitaxial deposition of the epitaxial stack, said conductor part being in contact with a thinned part of each semiconductor active layer for the extracting of the charge carriers from each said active semiconductor layer.

33. An opto-electronic device as claimed in claim 24, wherein said second contact means each comprise a conductor part and an insulator part extending parallel with the direction of epitaxial deposition of the epitaxial stack, said insulator part being located between said conductor part and a thinned part of each semiconductor active layer for the extracting of the charge carriers from each said active semiconductor layer.

34. An opto-electronic device as claimed in claim 21, wherein the substrate and each active semiconductor layer is comprised of a silicon-compatible alloy compound.

35. An opto-electronic device as claimed in claim 21, wherein the substrate and each active semiconductor layer is comprised of a germanium-compatible alloy compound.

36. An opto-electronic device as claimed in claim 21, wherein the active semiconductor layers include quantum wells.

37. An opto-electronic device as claimed in claim 21, wherein the active semiconductor layers include short period superlattices.

38. An opto-electronic device as claimed in claim 1, wherein said first contact means each comprise a conductor part extending parallel with the direction of epitaxial deposition of the epitaxial stack, said conductor part being in contact at the sidewall of each semiconductor active layer for the at least one of the injecting of the charge carriers into and the extracting of the charge carriers from each said active semiconductor layer.

39. An opto-electronic device as claimed in claim 21, wherein said first contact means each comprise a conductor part extending parallel with the direction of epitaxial deposition of the epitaxial stack, said conductor part being in contact at the sidewall of each semiconductor active layer for the at least one of the injecting of the charge carriers into and the extracting of the charge carriers from each said active semiconductor layer.

40. An opto-electronic device as claimed in claim 21, wherein said second contact means each comprise a conductor part extending parallel with the direction of epitaxial deposition of the epitaxial stack, said conductor part being in contact at the sidewall with a part of each semiconductor active layer for the at least one of the extracting of the charge carriers from and the injecting of the charge carriers into each said active semiconductor layer.

41. An opto-electronic device comprising:
a crystalline silicon substrate;
an insulator layer coextensive with a top surface of the crystalline substrate;
an epitaxial stack of alternating photon-active semiconductor layers and electrical-insulator layers above a central part of the top surface of the insulator layer;
first contact means formed on a first edge part of the top surface of the insulator layer, said first contact means extending parallel with a direction of epitaxial deposition and being in contact with one side wall of at least one active semiconductor layer for at least one of injecting charge carriers into and extracting charge carriers from the active semiconductor layer(s) associated therewith; and
second contact means formed on a second edge part of the top surface of the insulator layer, said second contact means extending parallel with the direction of epitaxial deposition and being in contact with a second side wall of at least one active semiconductor layer for at least one of extracting charge carriers from and injecting charge carriers into the active semiconductor layer(s) associated therewith;
wherein at least one of said first contact means and said second contact means interfaces with at least one semiconductor active layer region with reduced thickness with respect to its thickness at a center of the device.

42. An opto-electronic device as claimed in claim 41, wherein said first contact means each comprise a conductor part extending parallel with the direction of epitaxial deposition of the epitaxial stack, said conductor part being in contact at the sidewall of each semiconductor active layer for the at least one of the injecting of the charge carriers into and the extracting of the charge carriers from each said active semiconductor layer.

43. An opto-electronic device as claimed in claim 41, wherein said second contact means each comprise a conductor part extending parallel with the direction of epitaxial deposition of the epitaxial stack, said conductor part being in contact at the sidewall with a part of each semiconductor active layer for the at least one of the extracting of the charge carriers from and the injecting of the charge carriers into each said active semiconductor layer.

44. An opto-electronic device as claimed in claim 41, wherein each active semiconductor layer is comprised of a silicon-compatible alloy compound.

45. An opto-electronic device as claimed in claim 41, wherein each active semiconductor layer is comprised of a germanium-compatible alloy compound.

46. An opto-electronic device comprising:
a crystalline substrate;
a bottom electrode on the top surface of the crystalline substrate;
an insulator layer on the top surface of the bottom electrode;
an epitaxial stack of alternating photon-active semiconductor layers and electrical-insulator layers above a central part of the top surface of the insulator layer;
first contact means formed on a first edge part of the top surface of the insulator layer, said first contact means extending parallel with a direction of epitaxial deposition and being in contact with one side wall of at least one active semiconductor layer for at least one of injecting charge carriers into and extracting charge carriers from the active semiconductor layer(s) associated therewith;
second contact means formed on a second edge part of the top surface of the insulator layer, said second contact means extending parallel with the direction of epitaxial deposition and being in contact with a second side wall of at least one active semiconductor layer for at least one of extracting charge carriers from and injecting charge carriers into the active semiconductor layer(s) associated therewith; and
a top electrode on the top surface of the upper layer of the epitaxial stack:
wherein at least one of said first contact means and said second contact means comprise at least one barrier layer between a conductive material and the semiconductor active layer.

47. An opto-electronic device as claimed in claim 46, wherein said first contact means each comprise a conductor part extending parallel with the direction of epitaxial deposition of the epitaxial stack, said conductor part being in contact at the sidewall of each semiconductor active layer for the at least one of the injecting of the charge carriers into and the extracting of the charge carriers from each said active semiconductor layer.

48. An opto-electronic device as claimed in claim 46, wherein said second contact means each comprise a conductor part extending parallel with the direction of epitaxial deposition of the epitaxial stack, said conductor part being in contact at the sidewall with a part of each semiconductor active layer for the at least one of the extracting of the charge carriers from and the injecting of the charge carriers into each said active semiconductor layer.

49. An opto-electronic device as claimed in claim 46, wherein the substrate and each active semiconductor layer is comprised of a silicon-compatible alloy compound.

50. An opto-electronic device as claimed in claim 46, wherein the substrate and each active semiconductor layer is comprised of a germanium-compatible alloy compound.

51. An opto-electronic device as claimed in claim 46, wherein the active semiconductor layers include quantum wells.

52. An opto-electronic device as claimed in claim 46, wherein the active semiconductor layers include short period superlattices.

* * * * *